(12) United States Patent
Kato et al.

(10) Patent No.: US 10,755,904 B2
(45) Date of Patent: Aug. 25, 2020

(54) PROCESSING APPARATUS AND COLLIMATOR

(71) Applicant: Kabushiki Kaisha Toshiba, Minato-ku (JP)

(72) Inventors: Shiguma Kato, Yokohama (JP); Takahiro Terada, Yokohama (JP); Masayuki Tanaka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/159,812

(22) Filed: Oct. 15, 2018

(65) Prior Publication Data

US 2019/0051503 A1 Feb. 14, 2019

Related U.S. Application Data

(63) Continuation of application No. 15/509,017, filed as application No. PCT/JP2015/080966 on Nov. 2, 2015, now Pat. No. 10,147,589.

(30) Foreign Application Priority Data

Nov. 5, 2014 (JP) .................................. 2014-225605

(51) Int. Cl.
*H01J 37/34* (2006.01)
*C23C 14/34* (2006.01)
(Continued)

(52) U.S. Cl.
CPC ........ *H01J 37/3447* (2013.01); *C23C 14/225* (2013.01); *C23C 14/34* (2013.01); *C23C 14/564* (2013.01); *H01L 21/2855* (2013.01)

(58) Field of Classification Search
None
See application file for complete search history.

(56) References Cited

U.S. PATENT DOCUMENTS 5,223,108 A * 6/1993 Hurwitt ................. C23C 14/044
204/192.12
5,415,753 A * 5/1995 Hurwitt ............... C23C 14/0068
204/192.12
(Continued)

FOREIGN PATENT DOCUMENTS

JP 61-53717 A 3/1986
JP 5-136058 A 6/1993
(Continued)

OTHER PUBLICATIONS

International Search Report dated Feb. 9, 2016 in PCT/JP2015/080966.

*Primary Examiner* — John J Brayton
(74) *Attorney, Agent, or Firm* — Oblon, McClelland, Maier & Neustadt, L.L.P.

(57) ABSTRACT

According to an embodiment, a processing apparatus includes a generator mount, a first-object mount, and a first collimator. A particle generator capable of emitting particles is placed on the generator mount. A first object is placed on the first-object mount. The first collimator is placed between the generator mount and the first-object mount, and has first walls and second walls. In the first collimator, the first walls and the second walls form first through holes extending in a first direction from the generator mount to the first-object mount. Each of the second walls is provided with at least one first passage.

13 Claims, 15 Drawing Sheets

(51) Int. Cl.
*C23C 14/22* (2006.01)
*C23C 14/56* (2006.01)
*H01L 21/285* (2006.01)

(56) References Cited

U.S. PATENT DOCUMENTS

| | | | |
|---|---|---|---|
| 5,650,052 A * | 7/1997 | Edelstein | C23C 14/34 |
| | | | 204/192.12 |
| 6,521,010 B1 | 2/2003 | Takata | |
| 2003/0015421 A1* | 1/2003 | Cha | H01J 37/3408 |
| | | | 204/298.19 |
| 2005/0006223 A1* | 1/2005 | Nichols | C23C 14/044 |
| | | | 204/192.1 |
| 2005/0067272 A1 | 3/2005 | Pelhos | |
| 2006/0115052 A1 | 6/2006 | Hoheisel et al. | |
| 2007/0041505 A1 | 2/2007 | Hoffman | |
| 2013/0180850 A1 | 7/2013 | Rohermann et al. | |
| 2013/0322603 A1 | 12/2013 | Kurochi et al. | |
| 2014/0362978 A9 | 12/2014 | Kurochi et al. | |

FOREIGN PATENT DOCUMENTS

| | | | |
|---|---|---|---|
| JP | 6-132248 A | 5/1994 | |
| JP | 6-172974 A | 6/1994 | |
| JP | 7-41943 A | 2/1995 | |
| JP | 8-260139 A | 10/1996 | |
| JP | 9-176847 A | 7/1997 | |
| JP | 9-241839 A | 9/1997 | |
| JP | 10-48340 A | 2/1998 | |
| JP | 2001-85332 A | 3/2001 | |
| JP | 2005-29815 A | 2/2005 | |
| JP | 2007-52024 A | 3/2007 | |
| JP | 2007-504473 A | 3/2007 | |
| JP | 2010-127630 A | 6/2010 | |
| JP | 2013-88265 | 5/2013 | |
| JP | 2013-246170 A | 12/2013 | |
| JP | 2014-170008 A | 9/2014 | |
| JP | 2016-89224 A | 5/2016 | |
| TW | 201209205 A1 | 3/2012 | |
| WO | 1995/026566 | 10/1995 | |
| WO | WO-9526566 A1 * | 10/1995 | H01J 37/3408 |

* cited by examiner

PROCESSING APPARATUS AND COLLIMATOR

CROSS-REFERENCE TO RELATED APPLICATIONS

This application is a continuation of U.S. application Ser. No. 15/509,017, filed Mar. 6, 2017, which is a national stage application of International Application No. PCT/JP2015/080966, filed Nov. 2, 2015, which designates the United States, incorporated herein by reference, and which claims the benefit of priority from Japanese Patent Application No. 2014-225605, filed Nov. 5, 2014, the entire contents of which are incorporated herein by reference.

FIELD

Embodiments described herein relate generally to a processing apparatus and a collimator.

BACKGROUND

For example, a sputtering apparatus that forms a metal film on a semiconductor wafer includes a collimator for aligning directions of metal particles to be deposited. The collimator has walls with a large number of through holes to allow to pass therethrough substantially vertically flying particles and to block obliquely flying particles with respect to an object to be processed such as a semiconductor wafer.

The directions of the particles passing through the collimator can be inclined within a predetermined range relative to a desired direction. The collimator may block usable, obliquely flying particles in addition to unnecessary particles.

DETAILED DESCRIPTION

According to an embodiment, a processing apparatus comprises a generator mount, a first-object mount, and a first collimator, a particle generator is placed on the generator mount. The particle generator is capable of emitting particles. The first-object mount is spaced apart from the generator mount, on which a first object is placed, the first object receives the particles. The first collimator is placed between the generator mount and the first-object mount, includes first walls and second walls, in which the first walls and the second walls form first through holes extending in a first direction from the generator mount to the first object mount, and each of the second walls is provided with at least one first passage which penetrates the second wall and through which the particles can pass.

A first embodiment is described below with reference to FIG. 1 to FIG. 4. In the present specification, generally, vertically upward direction is defined to be upward and vertically downward direction is defined to be downward. Constituent elements according to embodiments may be expressed differently and may be described differently. Other expressions than those herein and other descriptions thereof should not be precluded. Further, other expressions of constituent elements not given different expressions and their different descriptions should not be precluded.

Figure 1:
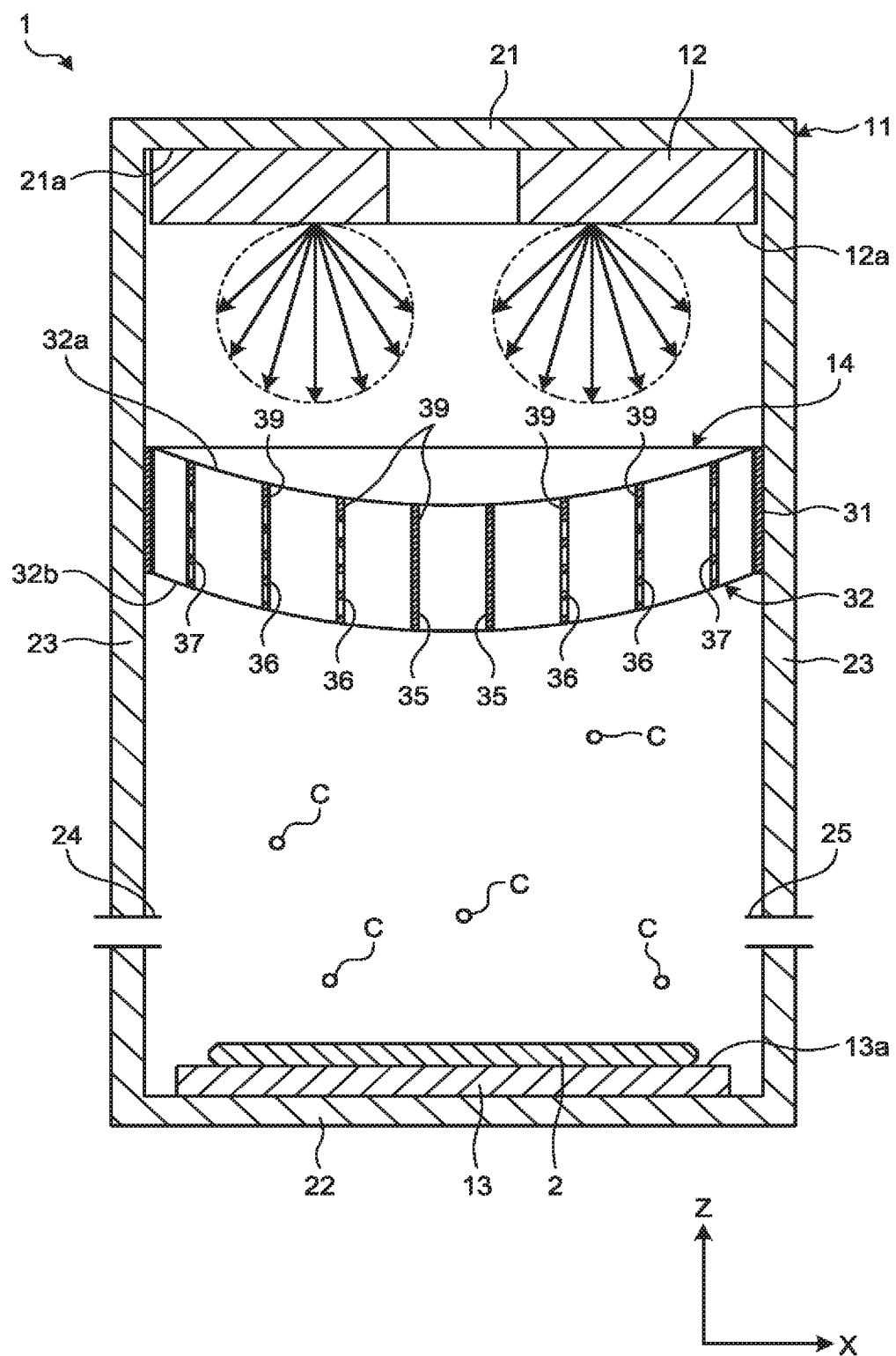
FIG. 1 is a sectional view schematically illustrating a sputtering apparatus according to a first embodiment.

FIG. 1 is a sectional view schematically illustrating a sputtering apparatus 1 according to the first embodiment. The sputtering apparatus 1 is an example of a processing apparatus. The sputtering apparatus 1 forms a film of metal particles on a surface of a semiconductor wafer 2, for example. The semiconductor wafer 2 is an example of a first object and an object. The sputtering apparatus 1 is not limited thereto, and for example, can form a film on another object.

The sputtering apparatus 1 includes a processing chamber 11, a target 12, a stage 13, and a collimator 14. The target 12 is an example of a particle generator. The collimator 14 is an example of a first collimator and a collimator.

As illustrated in the drawings, in the present specification, an X-axis, a Y-axis, and a Z-axis are defined. The X-axis, the Y-axis, and the Z-axis are orthogonal to each other. The X-axis extends along the width of the processing chamber 11. The Y-axis extends along the depth (length) of the processing chamber 11. The Z-axis extends along the height of the processing chamber 11. In the following, it is assumed that the Z-axis extends vertically. The Z-axis of the sputtering apparatus 1 can be inclined vertically.

The processing chamber 11 has a sealable box shape. The processing chamber 11 includes a top wall 21, a bottom wall 22, side walls 23, a discharge port 24, and a feed port 25. The top wall 21 and the bottom wall 22 are arranged opposite to each other in a direction along the Z-axis (vertical direction). The top wall 21 is located above the bottom wall 22 with a predetermined gap. The side walls 23 extend in the direction along the Z-axis to connect the top wall 21 and the bottom wall 22.

The discharge port 24 opens into the processing chamber 11 and is connected to a vacuum pump, for example. The vacuum pump sucks the air inside the processing chamber 11 from the discharge port 24, thereby placing the inside of the processing chamber 11 in a vacuum state.

The feed port 25 opens into the processing chamber 11 and is connected to a tank that stores therein an inert gas such as an argon gas. The argon gas can be fed from the feed port 25 into the processing chamber 11 in a vacuum state.

The target 12 is, for example, an annular metal plate used as a particle generator. The shape of the target 12 is not limited thereto and can have a disk shape, for example. The target 12 is attached to an inner face 21a of the top wall 21 of the processing chamber 11, for example, via a backing plate. The backing plate is used as a coolant and an electrode of the target 12. The target 12 can be attached directly to the top wall 21.

The inner face 21a of the top wall 21 is an example of a generator mount. The inner face 21a is substantially flat, facing downward. The target 12 is placed on the inner face 21a via the backing plate. The generator mount is not limited to an independent member or part, and can be a specific position of a certain member or part. The generator mount can be the backing plate.

The target 12 has a bottom face 12a. The bottom face 12a is substantially flat, facing downward. When a voltage is applied to the target 12, an argon gas fed into the processing chamber 11 is ionized to generate plasma. Collision of argon ions with the target 12 causes particles C of a film material of the target 12 to fly from the bottom face 12a, for example. In other words, the target 12 can emit the particles C.

The particles C are an example of particles in the present embodiment, and are fine particles of the film material forming the target 12. The particles can be various kinds of particles constituting a substance or an energy line such as molecules, atoms, atomic nuclei, elementary particles, vapor (vaporized substance), and electromagnetic waves (photons), which are smaller than the particles C.

The stage 13 is attached to the bottom wall 22 of the processing chamber 11. That is, the stage 13 is disposed apart from the target 12 in the vertical direction. The bottom wall 22 can be used as an example of a first stage, instead of the stage 13. The stage 13 has a mount face 13a. The mount face 13a of the stage 13 supports the semiconductor wafer 2. The semiconductor wafer 2 has, for example, a disk shape. The semiconductor wafer 2 can have a different shape.

The mount face 13a of the stage 13 is an example of a first-object mount, an emission target, and an object mount. The mount face 13a is substantially flat, facing upward. The mount face 13a is vertically spaced apart from the inner face 21a of the top wall 21, facing the inner face 21a. The semiconductor wafer 2 is mounted on the mount face 13a. The first-object mount, the emission target, and the object mount are not limited to an independent member or part, and can be a specific position of a certain member or part.

The collimator 14 is placed between the target 12 and the stage 13 in the direction along the Z-axis (vertical direction). In other words, the collimator 14 is placed between the inner face 21a of the top wall 21 and the mount face 13a of the stage 13 in the direction along the Z-axis (vertical direction). The direction along the Z-axis and the vertical direction are oriented from the inner face 21a of the top wall 21 toward the mount face 13a of the stage 13, and an example of a first direction. That is, the collimator 14 is placed between the target 12 and the semiconductor wafer 2. The collimator 14 is attached to, for example, the side walls 23 of the processing chamber 11.

Figure 2:
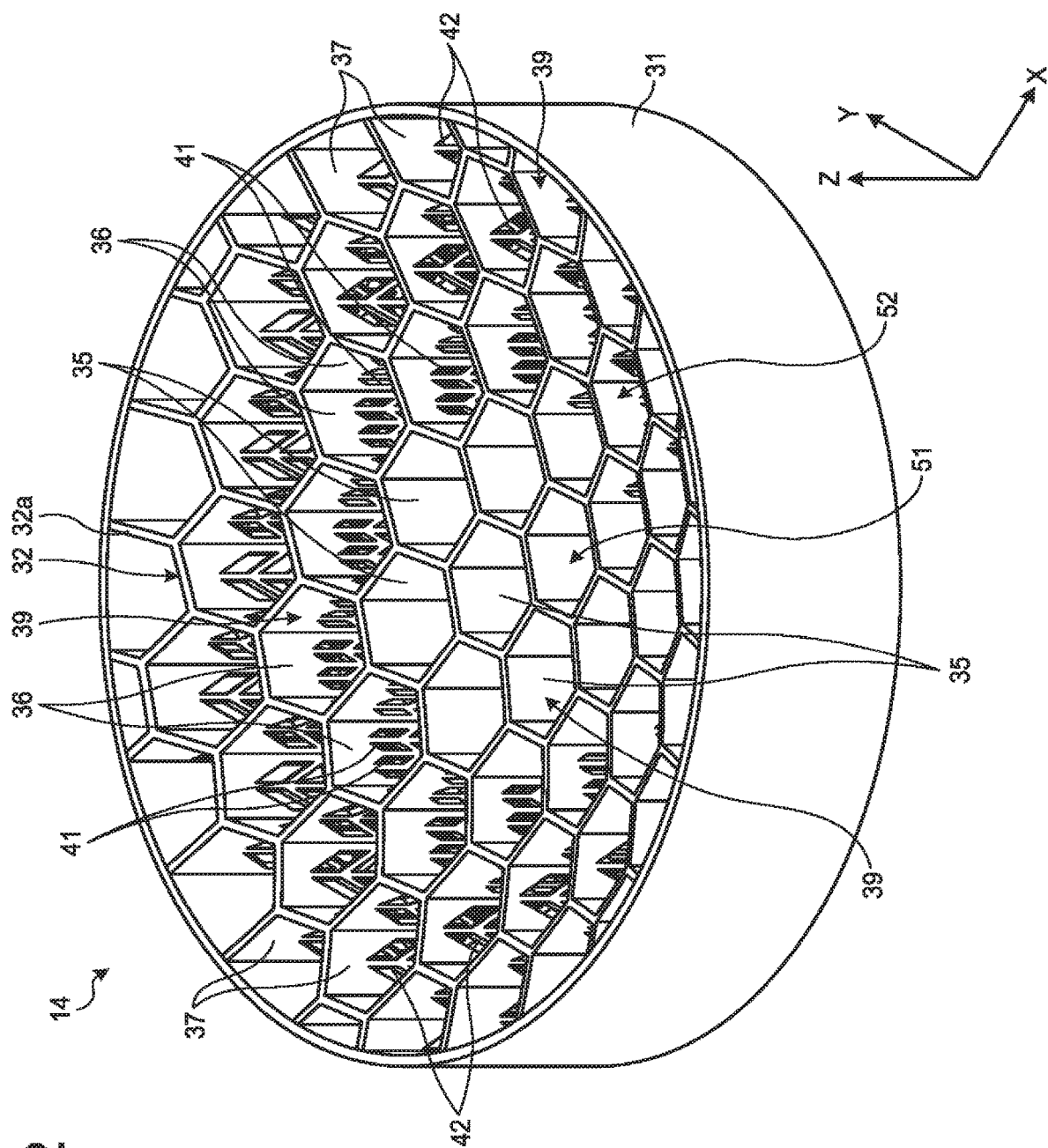
FIG. 2 is a perspective view illustrating a collimator according to the first embodiment.
Figure 3:
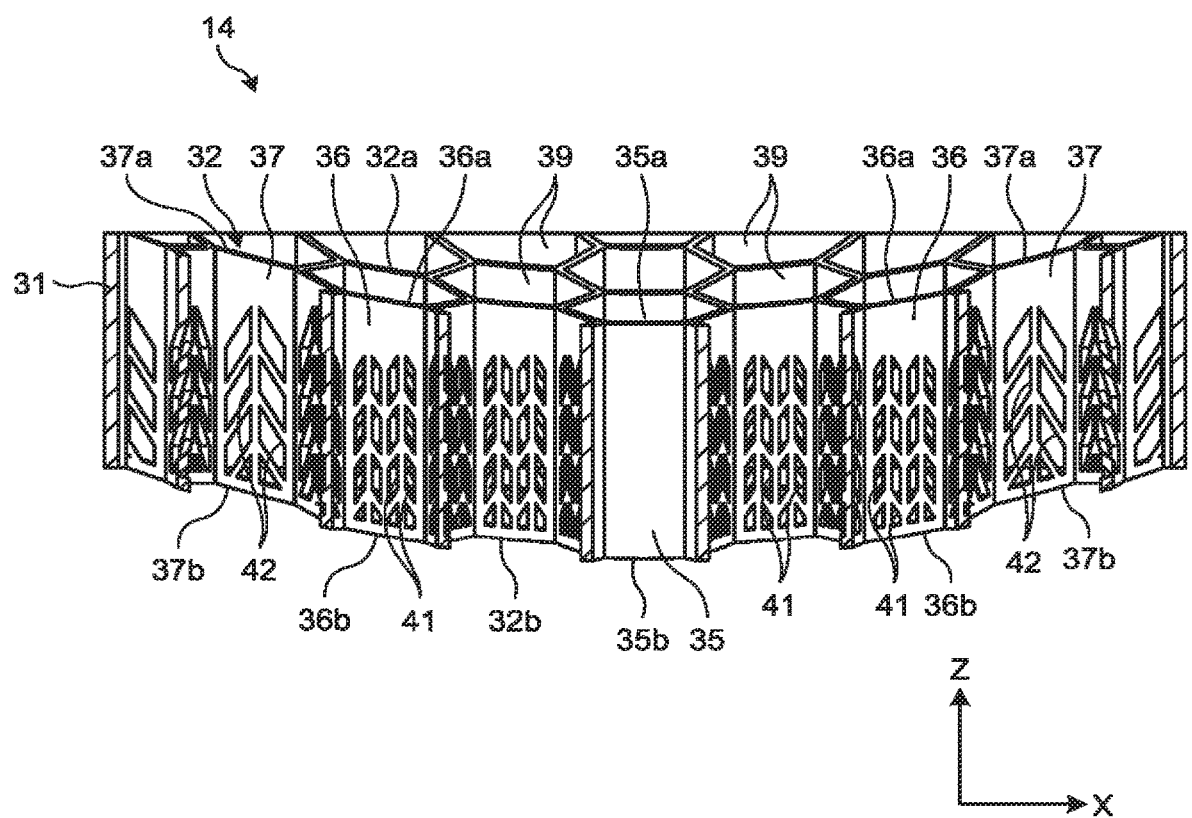
FIG. 3 is a sectional view illustrating the collimator according to the first embodiment.

FIG. 2 is a perspective view illustrating the collimator 14. FIG. 3 is a sectional view illustrating the collimator 14. As illustrated in FIG. 2 and FIG. 3, the collimator 14 includes a frame 31 and a rectifier 32.

The frame 31 is a wall of a cylindrical shape extending in the vertical direction. The frame 31 is not limited thereto, and can have a different shape such as a rectangle. A sectional area of the frame 31 is larger than a sectional area of the semiconductor wafer 2. The rectifier 32 is provided inside the cylindrical frame 31 in an XY plane. The frame 31 and the rectifier 32 are integrally formed.

The rectifier 32 includes shield walls 35, first communicating walls 36, and second communicating walls 37. The shield walls 35 are an example of a first wall and a wall. The first and second communicating walls 36 and 37 are an example of a second wall and a wall.

In the rectifier 32, the shield walls 35, the first communicating walls 36, and the second communicating walls 37 form through holes 39. The through holes 39 are an example of a first through hole and a through hole. The through holes 39 are hexagonal holes extending in the vertical direction. In other words, the shield walls 35, the first communicating walls 36, and the second communicating walls 37 form hexagonal cylinder including the through holes 39 (a honeycomb structure). The shape of the through holes 39 is not limited thereto.

As illustrated in FIG. 3, the rectifier 32 includes an top end 32a and a bottom end 32b. The top end 32a is one vertical end of the rectifier 32, and faces the target 12 and the inner face 21a of the top wall 21. The bottom end 32b is the other vertical end of the rectifier 32, and faces the semiconductor wafer 2 supported on the stage 13 and the mount face 13a of the stage 13.

The through holes 39 extend from the top end 32a to the bottom end 32b of the rectifier 32. That is, the through holes 39 open toward the target 12 and the semiconductor wafer 2 supported on the stage 13.

The shield walls 35, the first communicating walls 36, and the second communicating walls 37 are substantially rectangular (square) plates extending in the vertical direction. That is, the shield walls 35, the first communicating walls 36, and the second communicating walls 37 extend in the same direction.

The first communicating walls 36 are provided with first communicating holes 41. The first communicating holes 41 are an example of a first passage and a passage, and may also be referred to as opening. The first communicating holes 41 are, for example, parallelogram holes aligned vertically and horizontally. Herein, horizontal direction refers to a direction orthogonal to the Z-axis on the XY plane. The shape and arrangement of the first communicating holes 41 are not limited thereto.

The first communicating holes 41 are longer in length vertically than horizontally. The horizontal direction is an example of a direction orthogonal to the first direction and a direction orthogonal to an extending direction of the through holes. That is, the first communicating holes 41 are vertically extending holes.

The first communicating holes 41 connect two through holes 39 that are partitioned with each first communicating wall 36 provided with the first communicating holes 41. In other words, the first communicating holes 41 penetrate the first communicating wall 36 and opens into one through hole 39 and its adjacent through hole 39.

The second communicating walls 37 are provided with second communicating holes 42. The second communicating holes 42 are an example of a second passage and a passage. The second communicating holes 42 are, for example, parallelogram holes aligned vertically and horizontally. The shape and arrangement of the second communicating holes 42 are not limited thereto.

The second communicating holes 42 are longer in length vertically than horizontally. That is, the second communicating holes 42 are vertically extending holes.

The second communicating holes 42 connect two through holes 39 that are partitioned with each second communicating wall 37 provided with the second communicating holes 42. In other words, the second communicating holes 42 penetrate the second communicating wall 37 and opens into one through hole 39 and its adjacent through hole 39.

The second communicating holes 42 are larger than the first communicating holes 41. The density of the second communicating holes 42 in the second communicating wall 37 is larger than that of the first communicating holes 41 in the first communicating wall 36. The density of the second communicating holes 42 represents a ratio of the total size of the second communicating holes 42 to the size of the second communicating wall 37. The second communicating holes 42 may be equal to or smaller in size than the first communicating holes as long as the density of the second communicating holes 42 in the second communicating wall 37 is larger than that of the first communicating holes 41 in the first communicating wall 36.

The shield walls 35 each have a top end 35a and a bottom end 35b. The first communicating walls 36 each have a top end 36a and a bottom end 36b. The second communicating walls 37 each have a top end 37a and a bottom end 37b.

The top ends 35a, 36a, and 37a are one vertical ends of the shield walls 35, the first communicating walls 36, and the second communicating walls 37, respectively, and face the target 12 and the inner face 21a of the top wall 21. The top ends 35a, 36a, and 37a are an example of one end in an extending direction of the through hole. The top ends 35a, 36a, and 37a form the top end 32a of the rectifier 32.

The top end 32a of the rectifier 32 is depressed in a curved form with respect to the target 12 and the inner face 21a of the top wall 21. In other words, the top end 32a of the rectifier 32 is curved so as to be away from the target 12 and the inner face 21a of the top wall 21. The top end 32a is not limited thereto. For example, only a central part of the top end 32a can be depressed with respect to the target 12 and the inner face 21a of the top wall 21.

The bottom ends 35b, 36b, and 37b are the other vertical ends of the shield walls 35, the first communicating walls 36, and the second communicating walls 37, respectively, and face the semiconductor wafer 2 supported on the stage 13 and the mount face 13a of the stage 13. The bottom ends 35b, 36b, and 37b form the bottom end 32b of the rectifier 32.

The bottom end 32b of the rectifier 32 projects in a curved form toward the semiconductor wafer 2 supported on the stage 13 and the mount face 13a of the stage 13. The bottom end 32b is not limited thereto. For example, only a central part of the bottom end 32b can project toward the mount face 13a of the stage 13.

The top end 32a and the bottom end 32b of the rectifier 32 have substantially the same curved shape. The vertical lengths of the shield walls 35, the first communicating walls 36, and the second communicating walls 37 are substantially the same. The vertical lengths of the shield walls 35, the first communicating walls 36, and the second communicating walls 37 can be different depending on positions.

Figure 4:
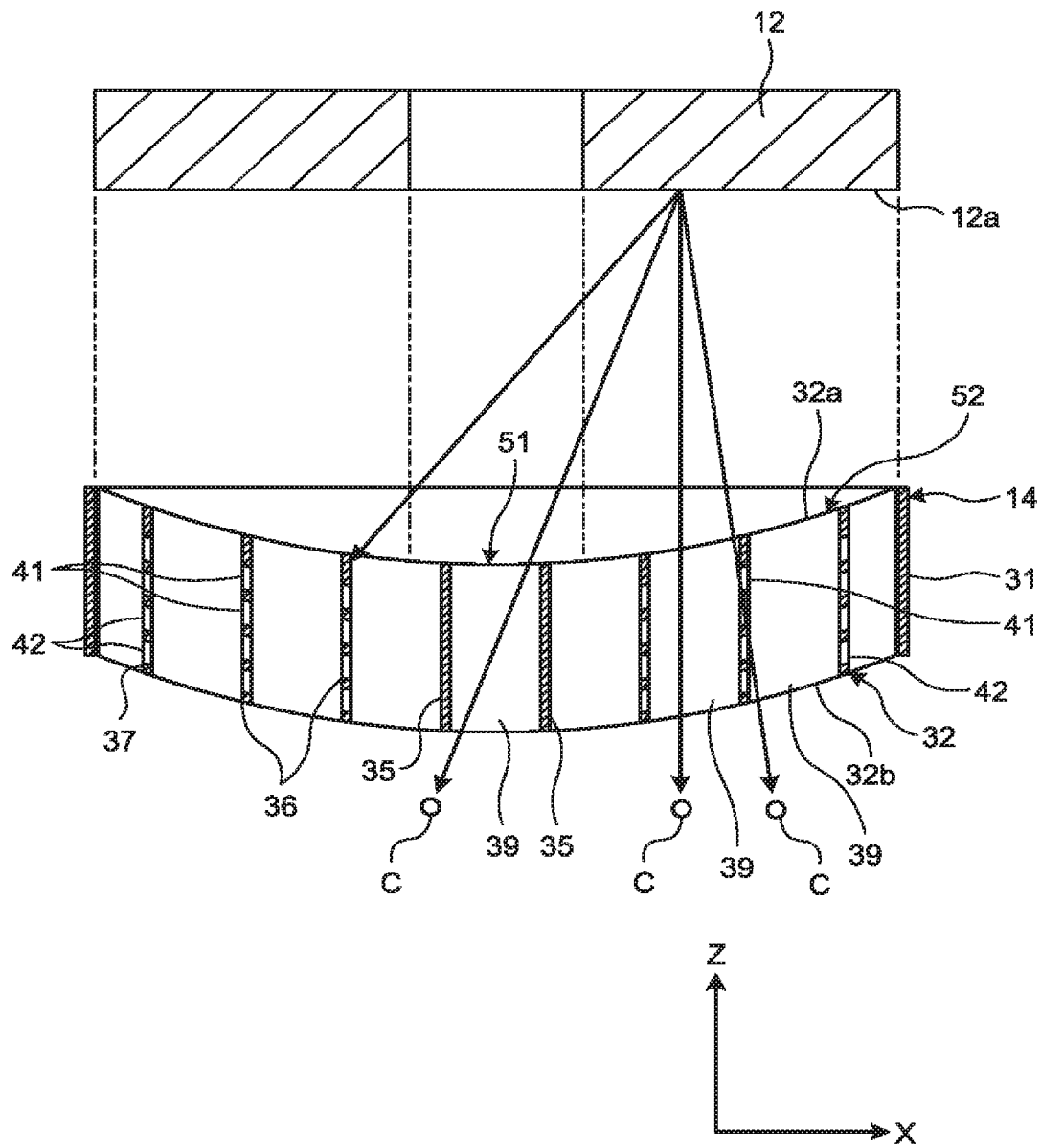
FIG. 4 is a sectional view schematically illustrating a target and the collimator according to the first embodiment.

FIG. 4 is a sectional view schematically illustrating the target 12 and the collimator 14. As illustrated in FIG. 2 and FIG. 4, the rectifier 32 includes a first part 51 and a second part 52. The first part 51 is an example of a first part and a region offset from the target. The second part 52 is an example of a second part and a region facing the target. The first and second parts 51 and 52 can be also referred to as positions, ranges, and regions.

As illustrated by the dot-and-dash lines in FIG. 4, the first part 51 faces a location offset from the target 12. In other words, the first part 51 is a part vertically opposite to the top wall 21. Thus, the first part 51 in the present embodiment is a circular part corresponding to an inner part of an annular target 12, for example.

As illustrated by the dot-and-dash lines in FIG. 4, the second part 52 faces the target 12 in the vertical direction. In other words, the second part 52 is vertically aligned with the target 12 and located below the target 12. Thus, the second part 52 in the present embodiment is an annular part corresponding to the shape of the target 12, and located outside the first part 51 in the horizontal direction.

A flying direction of the particles C from the bottom face 12a of the target 12 is found according to the cosine law (Lambert's cosine law). That is, the particles C flying from a certain point on the bottom face 12a mostly fly in a normal direction (vertical direction) of the bottom face 12a. Thus, the vertical direction is an example of a direction in which the particle generator placed on the generator mount emits at least one particle. The number of particles obliquely flying at an angle θd (obliquely crossing) with respect to the normal direction is approximately proportional to the cosine (cos θ) of the number of particles flying in the normal direction.

In the following, the particles C emitted vertically from the target 12 may be referred to as vertical components, and the particles C emitted from the target 12 in a vertically inclined direction may be referred to as oblique components. A ratio of the amount of oblique components traveling to the first part 51 to the amount of vertical components traveling to the first part 51 is larger than a ratio of the amount of oblique components traveling to the second part 52 to the amount of vertical components traveling to the second part 52. In other words, the oblique components are likely to arrive in the first part 51 rather than the second part 52.

The first part 51 is formed of the shield walls 35. In other words, in the first part 51, a larger number of the shield walls 35 are arranged than that of the first and second communicating walls 36 and 37. That is, the number of the shield walls 35 in the first part 51 is larger than the total number of the first communicating walls 36 and the second communicating walls 37 in the first part 51. The first and second communicating walls 36 and 37 can be provided in the first part 51 in addition to the shield walls 35.

The second part 52 is formed of the first and second communicating walls 36 and 37. In other words, in the second part 52, a larger number of the first and second communicating walls 36 and 37 than that of the shield walls 35 are disposed. That is, the total number of the first communicating walls 36 and the second communicating walls 37 in the second part 52 is larger than the number of the shield walls 35 in the second part 52. The shield walls 35 can be provided in addition to the first and second communicating walls 36 and 37 in the second part 52. Further, the second part 52 can be formed of only either of the first communicating walls 36 and the second communicating walls 37.

With the first part 51 formed of only one kind of the shield walls 35, the first communicating walls 36, and the second communicating walls 37, the second part 52 includes another kind of the shield walls 35, the first communicating walls 36, and the second communicating walls 37. That is, component ratios of the shield walls 35, the first communicating walls 36, and the second communicating walls 37 in the first part 51 and the second part 52 are different from each other.

The second part 52 includes locations in the outer periphery, for example, in which the vertical components of the particles C are more likely to arrive than other locations. In the outer periphery of the second part 52, a larger number of the second communicating walls 37 are arranged than that of the first communicating walls 36. The locations where the vertical components are likely to arrive are not limited thereto, and change depending on various conditions.

As described above, in the rectifier 32, the shield walls 35, the first communicating walls 36, and the second communicating walls 37 are set in a predetermined disposition in accordance with the shape of the target 12 placed on the inner face 21a of the top wall 21. That is, the positions of the shield walls 35, the first communicating walls 36, and the second communicating walls 37 in the rectifier 32 are set corresponding to the shape of the target 12. In other words, the passages (the first and second communicating holes 41 and 42) are unevenly set in the walls (the shield walls 35, the first communicating walls 36, and the second communicating walls 37) of the collimator 14.

The positions of the first part 51 and the second part 52 are not limited to the above positions. When the ratio of the amount of oblique components to that of vertical components traveling toward the first part 51 is larger than the ratio of the amount of oblique components and that of vertical components traveling toward the second part 52, the first and second parts 51 and 52 can be provided at other positions. That is, the first and second parts 51 and 52 are set based on the amounts of vertical components and oblique components at the respective positions in the collimator 14.

Further, the disposition of the shield walls 35, the first communicating walls 36, and the second communicating walls 37 is not limited to the one described above. For example, the density of the shield walls 35, the first communicating walls 36, and the second communicating walls 37 can be set also based on various factors such as the shape of the target 12, the position of the collimator 14, and an applied voltage.

The above collimator 14 can be additive manufactured, for example, by a 3D printer. Thereby, the first and second communicating walls 36 and 37 provided with the first and second communicating holes 41 and 42 can be easily formed. The collimator 14 can be manufactured by another method in addition to the above method. The collimator 14 is made from metal, for example, but it can also be made from other materials.

As illustrated in FIG. 4, the particles C fly from the bottom face 12a of the target 12. Vertically flying particles C fly through the through holes 39 of the collimator 14 toward the semiconductor wafer 2 supported on the stage 13. The vertically flying particles C may attach to, for example, the top ends 35a, 36a, and 37a of the shield walls 35, the first communicating walls 36, and the second communicating walls 37.

Meanwhile, there are particles C flying in an inclined direction with respect to the vertical direction (inclined direction). The flying particles C inclined at an angle over a predetermined range relative to the vertical direction attach to the shield walls 35, the first communicating walls 36, and the second communicating walls 37. That is, the collimator 14 blocks the flying particles C vertically inclined at the angle outside the predetermined range.

The flying particles C vertically inclined at an angle within a predetermined range fly through the through holes 39 of the collimator 14 toward the semiconductor wafer 2 supported on the stage 13. The particles C flying in the inclined direction can pass through the first communicating holes 41 of the first communicating walls 36 or the second communicating holes 42 of the second communicating walls 37. The particles C vertically inclined at the angle outside the predetermined range may also attach to the shield walls 35, the first communicating walls 36, and the second communicating walls 37.

The particles C having passed through the through holes 39 of the collimator 14 attach to and accumulate on the semiconductor wafer 2 to form a film on the semiconductor wafer 2. In other words, the semiconductor wafer 2 receives the particles C emitted from the target 12. The orientations (directions) of the particles C having passed through the through holes 39 are vertically aligned within a predetermined range. Thus, the directions of the particles C to be deposited on the semiconductor wafer 2 are controlled according to the shape of the collimator 14.

In the collimator 14 of the sputtering apparatus 1 according to the first embodiment, the vertically extending through holes 39 are formed by the shield walls 35, and the first and second communicating walls 36 and 37 provided with the first and second communicating through holes 41 and 42. Thereby, the particles, which are emitted from the target 12 in a vertically inclined direction (inclined direction), can pass through the first and second communicating through holes 41 and 42 of the first and second communicating walls 36 and 37. In this manner, the collimator 14 of the sputtering apparatus 1 can allow the particles C, emitted from the target 12 at a vertical inclination within the predetermined angle range, to pass through, and block the particles C emitted from the target 12 at a large vertical inclination over the predetermined angle range. Thereby, the sputtering apparatus 1 can form a film from the particles C flying in an inclined direction, improving sputtering efficiency. The particles C flying at a vertical inclination angle outside the predetermined range are blocked by the shield walls 35 and the first and second communicating walls 36 and 37. Thus, the directions of the particles C to be deposited can be controlled within the predetermined range with respect to the vertical direction.

More first and second communicating walls 36 and 37 are arranged in number than the shield walls 35 at the vertical positions facing the target 12. Because the particles C fly from the target 12 according to the cosine law, the ratio of the particles flying with a vertical inclination within the predetermined range is high at the vertical positions facing the target 12. By disposing a larger number of the first and second communicating walls 36 and 37 at these positions, the particles C flying in the vertically inclined direction within the predetermined range can pass through the first and second communicating holes 41 and 42. Thus, a film can be formed from the particles C flying in the vertically inclined direction within the predetermined range, improving the sputtering efficiency.

On the other hand, more shield walls 35 are arranged in number than the first and second communicating walls 36 and 37 at positions facing a location offset vertically from the target 12. At the vertically offset positions from the target 12, the ratio of the particles C flying in the vertically inclined direction outside the predetermined range is high. By disposing a larger number of the shield walls 35 at these positions, the particles C flying in the vertically, largely inclined direction over the predetermined range can be blocked, more accurately controlling the directions of the particles C to be deposited.

More shield walls 35 are arranged in number than the first and second communicating walls 36 and 37 in the first part 51 in which the particles C flying in the inclined direction (the oblique components) arrive at a higher ratio. Because the particles C fly from the target 12 according to the cosine law, in the first part 51 in which the particles C flying in the inclined direction arrive at a higher ratio, the particles C flying vertically, largely inclined beyond the predetermined range also arrive at a higher ratio. Arranging a larger number of the shield walls 35 in the first part 51 makes it possible to block the flying particles C vertically, largely inclined over the predetermined range, and to more accurately control the directions of the particles C to be deposited. Further, uniform sputtering is attainable as a whole.

In the second part 52 in which the vertically flying particles C arrive at a higher ratio, a larger number of the first and second communicating walls 36 and 37 are arranged than that of the shield walls 35. Because the particles C fly from the target 12 according to the cosine law, in the second part 52 in which the vertically flying particles C arrive at a higher ratio, the flying particles C vertically inclined within the predetermined range also arrive at a higher ratio. Arranging a larger number of the first and second communicating walls 36 and 37 in the second part 52 makes it possible for the flying particles C vertically inclined within the predetermined range to pass through the first and second communicating holes 41 and 42. Thereby, the flying particles C vertically inclined within the predetermined range can be used to form films, improving the sputtering efficiency.

The shield walls 35, the first communicating walls 36, and the second communicating walls 37 are in a predetermined disposition according to the shape of the target 12. Thereby, the flying particles C vertically inclined within the predetermined range can be used to form films, improving the sputtering efficiency. Further, the flying particles C vertically, largely inclined over the predetermined range can be blocked, to more accurately control the directions of the particles C to be deposited.

The density of the second communicating holes 42 in the second communicating walls 37 is higher than that in the first communicating walls 36. That is, the second communicating walls 37 can allow more flying particles C in the inclined direction to pass therethrough than the first communicating walls 36. Thereby, the first and second communicating walls 36 and 37 can be arranged in line with the distribution in the flying directions of the particles C, to efficiently use the flying particles C vertically inclined within the predetermined range for forming films.

The top ends 35a, 36a, and 37a of the shield walls 35, the first communicating walls 36, and the second communicating walls 37 that face the inner face 21a of the top wall 21 form the top end 32a of the rectifier 32, the top end 32a depressed with respect to the inner face 21a. This makes it difficult for the flying particles C from the center of the target 12 in the vertically inclined direction within the predetermined range to be blocked by the shield walls 35, the first communicating walls 36, and the second communicating walls 37. Thereby, the flying particles C vertically inclined within the predetermined range can be efficiently used to form films.

The bottom ends 35b, 36b, and 37b of the shield walls 35, the first communicating walls 36, and the second communicating walls 37 form the bottom end 32b of the rectifier 32, the bottom end 32b projecting toward the mount face 13a of the stage 13. This makes it possible for the flying particles C front the end of the target 12 with a vertical inclination at a larger angle than the predetermined range to be accurately blocked by the shield walls 35, the first communicating walls 36, and the second communicating walls 37. Thus, the directions of the particles C to be deposited can be controlled accurately.

The first and second communicating holes 41 and 42 have a longer vertical length than a horizontal length. This makes it difficult for the flying particles C vertically inclined within the predetermined range to be blocked by the shield walls 35, the first communicating walls 36, and the second communicating walls 37. Thus, the flying particles C vertically inclined within the predetermined range can be efficiently used to form a film.

A second embodiment is described below with reference to FIG. 5. In the following embodiments, constituent elements having identical functions as those of the above constituent elements are denoted by the same reference signs, and redundant explanations thereof may be omitted. The constituent elements denoted by the reference signs may not have common functions and properties and can have different functions and properties according to the respective embodiments.

Figure 5:
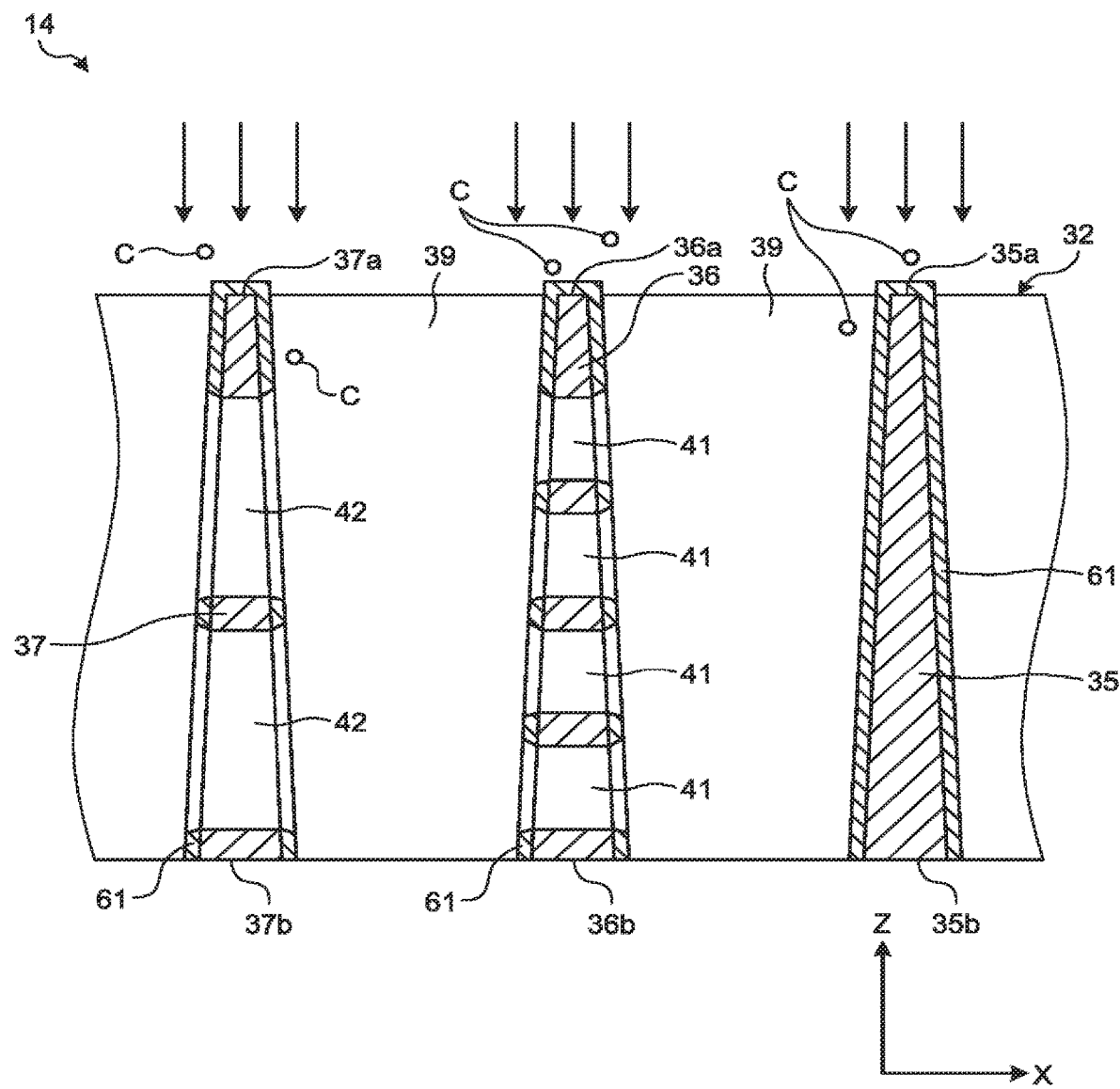
FIG. 5 is a sectional view schematically illustrating a part of a collimator according to a second embodiment.

FIG. 5 is a sectional view schematically illustrating a part of the collimator 14 according to the second embodiment. As illustrated in FIG. 5, the shield walls 35, the first communicating walls 36, and the second communicating walls 37 increase in thickness from the top ends 35a, 36a, and 37a to the bottom ends 35b, 36b, and 37b, respectively. In other words, the sectional areas of the through holes 39 decrease from the top end 32a to the bottom end 32b of the rectifier 32.

The flying particles C from the target 12 may attach to and accumulate on the shield walls 35, the first communicating walls 36, and the second communicating walls 37. The particles C form a film 61 on the surfaces of the shield walls 35, the first communicating walls 36, and the second communicating walls 37.

Having the film 61 formed thereon, the collimator 14 may be cleaned in order to remove the film 61. For example, the collimator 14 is immersed in a cleaning liquid that dissolves the film 61. This removes the film 61 from the surfaces of the shield walls 35, the first communicating walls 36, and the second communicating walls 37.

A length of time for which the collimator 14 is immersed in the cleaning liquid is set, for example, depending on the thickness of a thickest part of the film 61. Meanwhile, the cleaning liquid may dissolve the collimator 14. Because of this, the more even the thickness of the film 61 is, the further inhibited the dissolution of the collimator 14 is, resulting in increasing the durable life of the collimator 14.

In the sputtering apparatus 1 according to the second embodiment, the shield walls 35, the first communicating walls 36, and the second communicating walls 37 become thicker from the top ends 35a, 36a, and 37a toward the bottom ends 35b, 36b, and 37b. This makes it possible for the flying particles C from the target 12 to attach uniformly to the surfaces of the shield walls 35, the first communicating walls 36, and the second communicating walls 37. That is, the thickness of the film 61 becomes more uniform. In other words, the film 61 is inhibited from being formed only on the top ends 35a, 36a, and 37a of the shield walls 35, the first communicating walls 36, and the second communicating walls 37. Thus, the collimator 14 is inhibited from dissolving at the time of cleaning the film 61 of the particles C adhering to the collimator 14, thereby further increasing the durable life of the collimator 14.

Further, the flying particles C from the target 12 are likely to attach more uniformly to the surfaces of the shield walls 35, the first communicating walls 36, and the second communicating walls 37, therefore, the shield walls 35, the first communicating walls 36, the second communicating walls 37 can more securely hold the particles C thereon. This can inhibit the particles C attaching to the surfaces of the shield walls 35, the first communicating walls 36, and the second communicating walls 37 from falling, for example, onto the semiconductor wafer 2.

Figure 6:
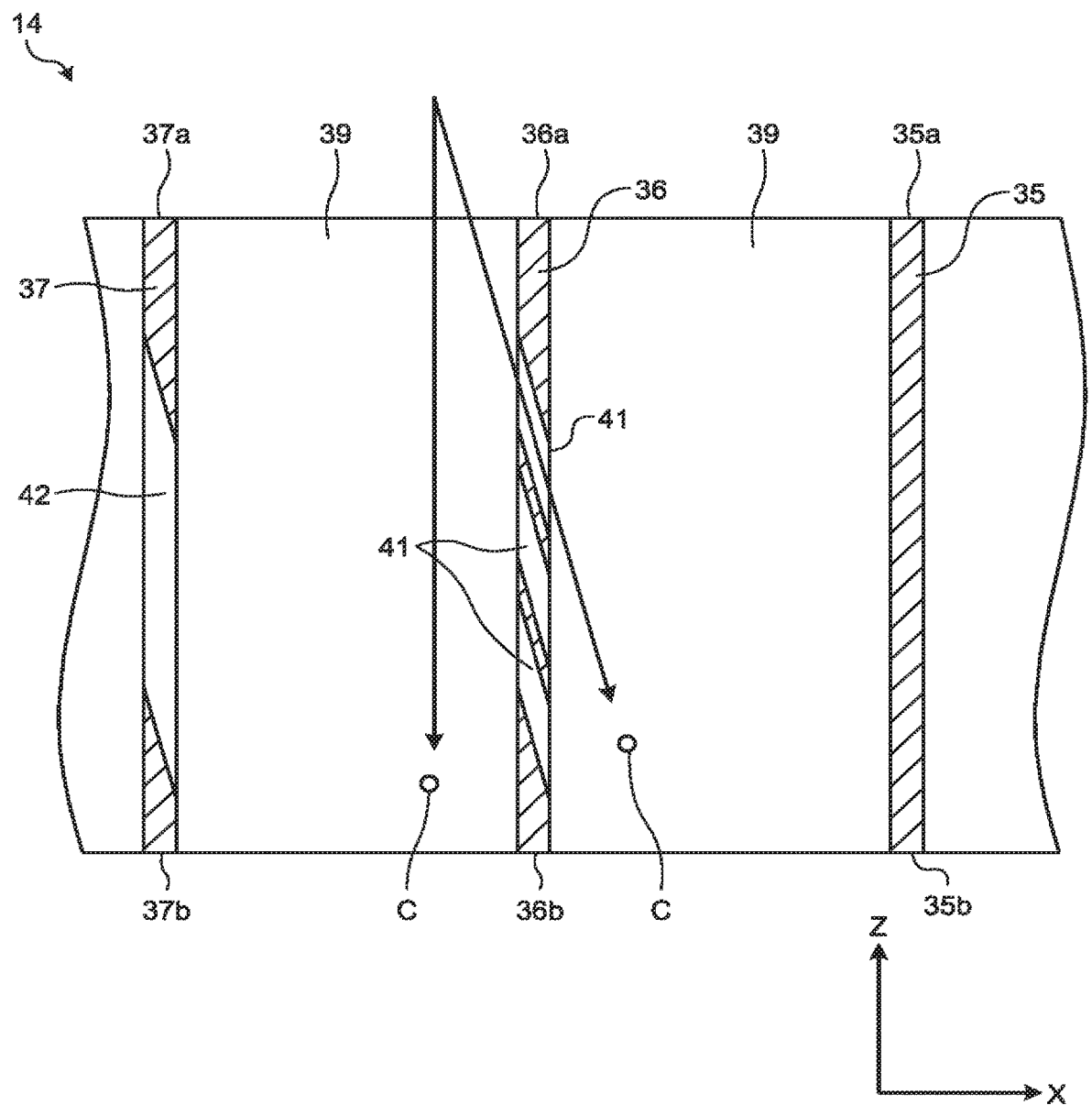
FIG. 6 is a sectional view schematically illustrating a part of a collimator according to a third embodiment.

A third embodiment is described below with reference to FIG. 6. FIG. 6 is a sectional view schematically illustrating a part of the collimator 14 according to the third embodiment. As illustrated in FIG. 6, the first and second communicating holes 41 and 42 extend in a vertically inclined direction. The extending direction of the first and second communicating holes 41 and 42 is vertically inclined at an angle within a predetermined range. The extending direction of the first communicating holes 41 and the extending direction of the second communicating holes 42 can be different from each other.

As described above, the particles C may fly from the target 12 in a vertically inclined direction. As the flying direction of the particles C comes closer to the extending directions of the first and second communicating holes 41 and 42, the particles C can more easily pass through the first and second communicating holes 41 and 42.

In the sputtering apparatus 1 according to the third embodiment, the first and second communicating holes 41 and 42 extend in the vertically inclined direction. The flying particles C in the direction closer to the extending directions of the first and second communicating holes 41 and 42 are more likely to pass through the first and second communicating holes 41 and 42. Thereby, the directions of the particles C to be deposited can be controlled more accurately.

Figure 7:
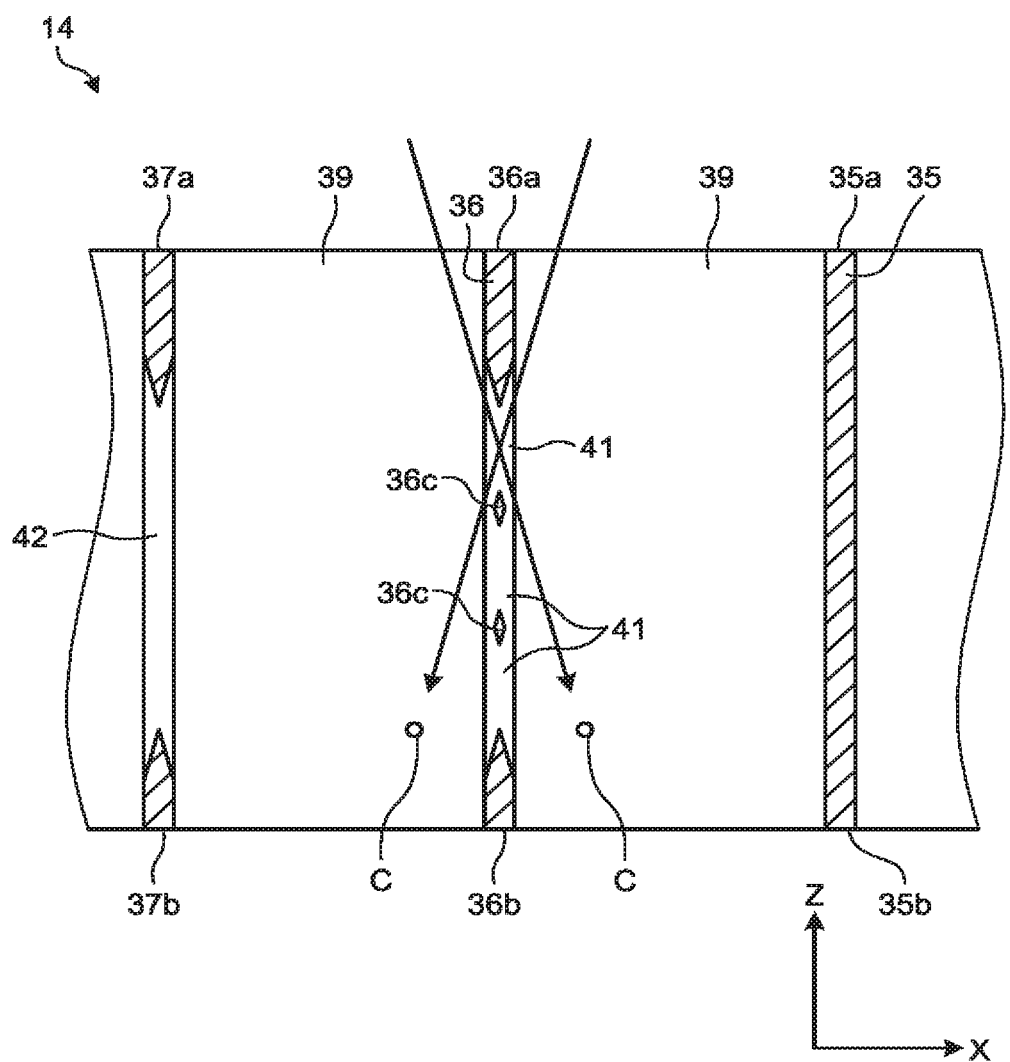
FIG. 7 is a sectional view schematically illustrating a part of a collimator according to a first modification of the third embodiment.

FIG. 7 is a sectional view schematically illustrating a part of the collimator 14 according to a first modification of the third embodiment. In the third embodiment, the first and second communicating holes 41 and 42 extend in the vertically inclined direction at the same angle. However, as illustrated in FIG. 7, the first and second communicating holes 41 and 42 can be a combination of holes extending at an inclination angle and extending at a different inclination angle, for example.

In the example illustrated in FIG. 7, the first and second communicating holes 41 and 42 are a combination of holes extending with a vertical inclination at −45° and extending with a vertical inclination at 45°. In this case, a sectional shape of a part 36c of the first communicating wall 36 located between two adjacent first communicating holes 41 is substantially rhombic. The first and second communicating walls 36 and 37 having such the first and second communicating holes 41 and 42 can allow to pass therethrough the particles C of the oblique components flying from either of the two adjacent through holes 39. The shapes of the first and second communicating holes 41 and 42 are not limited thereto.

Figure 8:
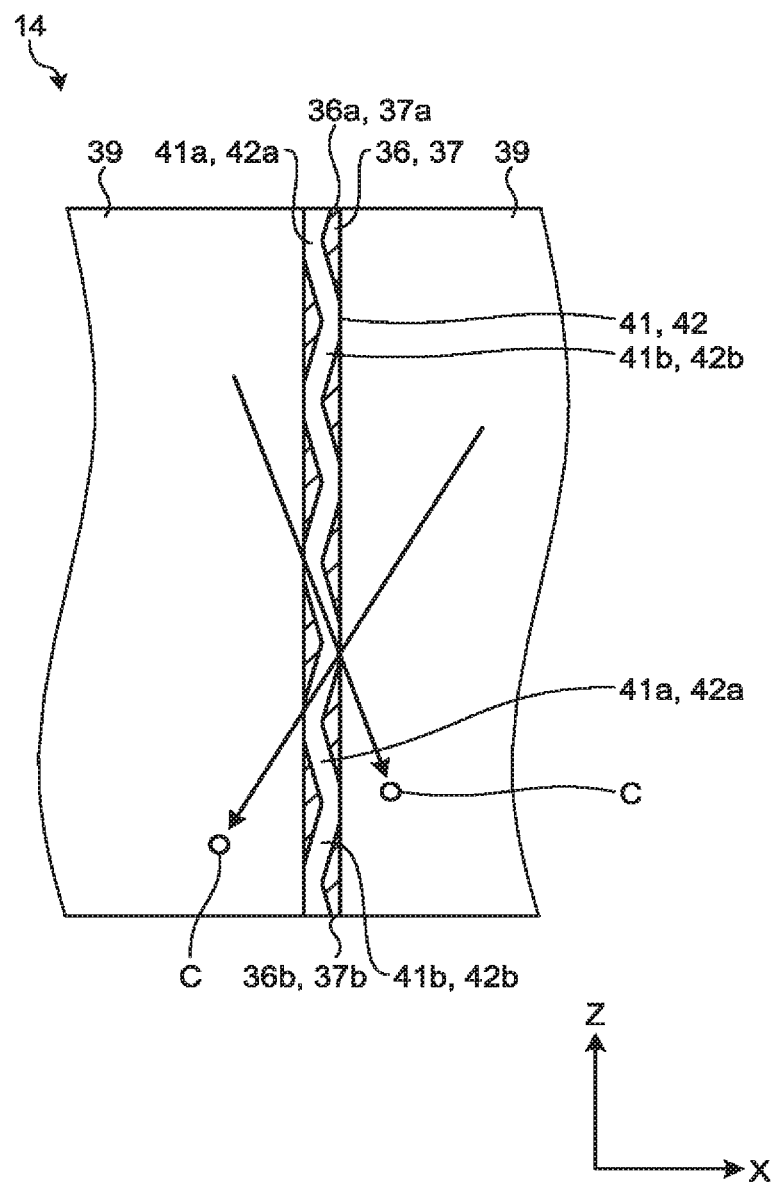
FIG. 8 is a sectional view schematically illustrating a part of a collimator according to a second modification of the third embodiment.

FIG. 8 is a sectional view schematically illustrating a part of the collimator 14 according to a second modification of the third embodiment. FIG. 8 illustrates an example of the first communicating wall 36 and the second communicating wall 37. As illustrated in FIG. 8, the first communicating holes 41 or the second communicating holes 42 each include first inclined holes 41a and 42a and second inclined holes 41b and 42b. The first inclined holes 41a and 42a are an example of a first extension passage. The second inclined holes 41b and 42b are both an example of a second extension passage.

The first inclined holes 41a and 42a both extend with a vertical inclination at −75°. The second inclined holes 41b and 42b both extend with a vertical inclination at 75°. In other words, the second inclined holes 41b and 42b extend in a direction intersecting with the first inclined holes 41a and 42a. Ends of the first inclined holes 41a and 42a are connected to ends of the second inclined holes 41b and 42b.

The ends of the first inclined holes 41a and 42a in the modification illustrated in FIG. 8 are connected to the ends of the second inclined holes 41b and 42b. This inhibits the first inclined holes 41a and 42a and the second inclined holes 41b and 42b from expanding and from allowing the flying particles C at an undesired inclination angle to pass therethrough. That is, the first inclined holes 41a and 42a can allow only the inclined particles C within a desired angle range (−75°±α with respect to the vertical direction) to pass therethrough. The second inclined holes 41b and 42b can allow only the inclined particles C within a desired angle range (75°±α with respect to the vertical direction) therethrough.

Figure 9:
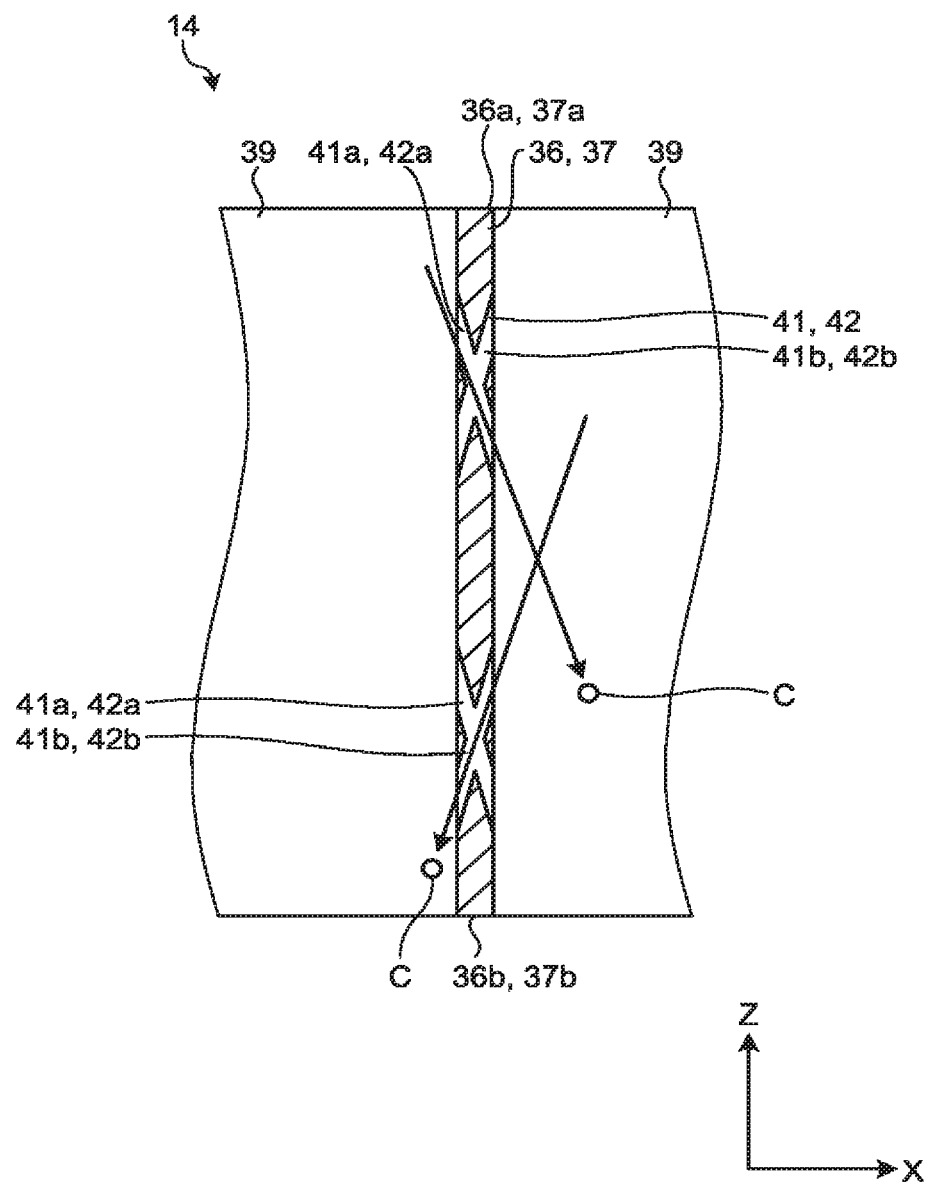
FIG. 9 is a sectional view schematically illustrating a part of a collimator according to a third modification of the third embodiment.

FIG. 9 is a sectional view schematically illustrating a part of the collimator 14 according to a third modification of the third embodiment. FIG. 9 illustrates an example of the first communicating wall 36 and the second communicating wall 37. As illustrated in FIG. 9, the first communicating holes 41 or second communicating holes 42 each include first inclined holes 41a and 42a and second inclined holes 41b and 42b.

The first inclined holes 41a and 42a intersect with the second inclined holes 41b and 42b. On one face of the first or second communicating wall 36 or 37, a part of the first or second communicating wall 36 or 37 lies between the first inclined holes 41a and 42a and the second inclined holes 41b and 42b. Similarly, on the other face of the first or second communicating wall 36 or 37, a part of the first or second communicating wall 36 or 37 lies between the first inclined holes 41a and 42a and the second inclined holes 41b and 42b.

On one face of the first or second communicating wall 36 or 37 in the modification illustrated in FIG. 9, a part of the first or second communicating wall 36 or 37 lies between the first inclined holes 41a and 42a and the second inclined holes 41b and 42b. This inhibits the first inclined holes 41a and 42a and the second inclined holes 41b and 42b from expanding and from allowing the flying particles C at an undesired inclination angle to pass therethrough.

Figure 10:
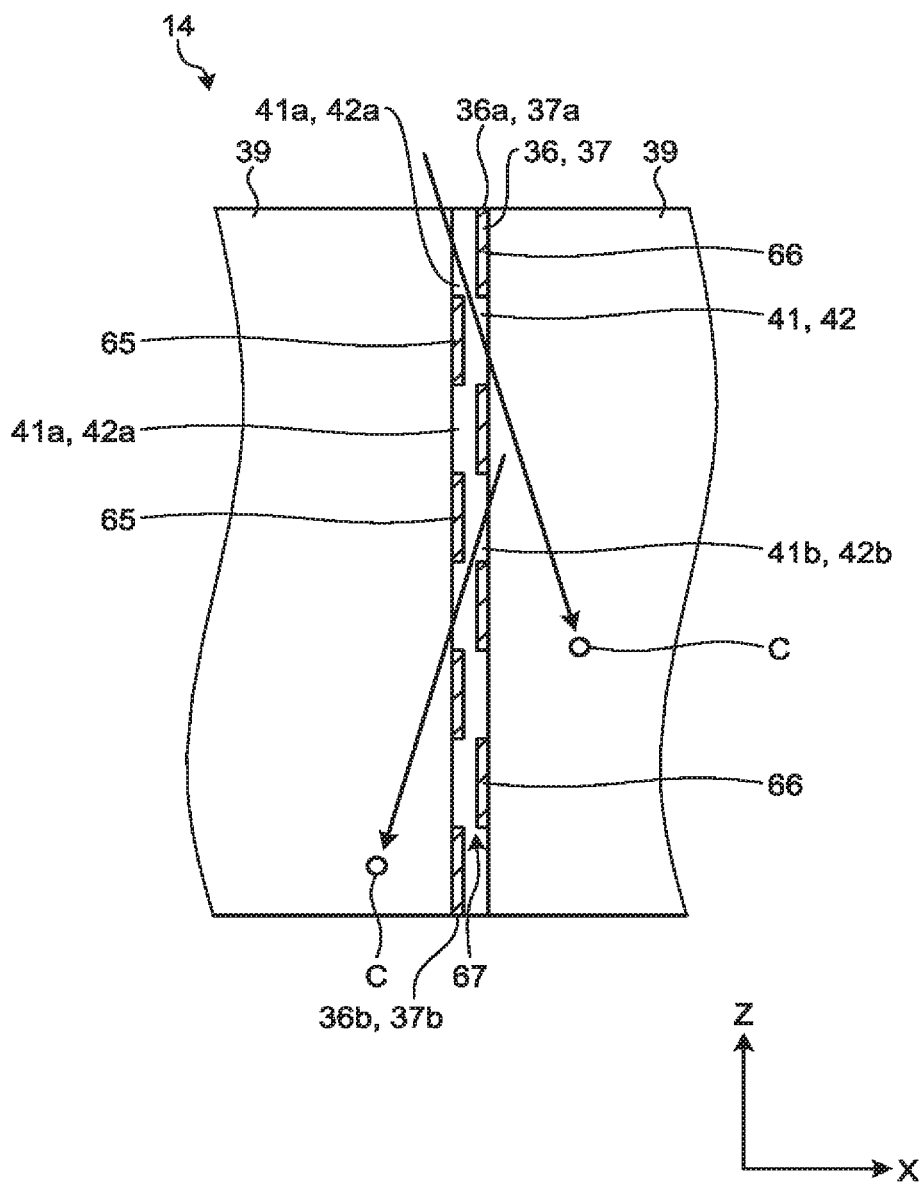
FIG. 10 is a sectional view schematically illustrating a part of a collimator according to a fourth modification of the third embodiment.

FIG. 10 is a sectional view schematically illustrating a part of the collimator 14 according to a fourth modification of the third embodiment. FIG. 10 illustrates an example of the first communicating wall 36 and the second communicating wall 37. As illustrated in FIG. 10, the first communicating holes 41 or the second communicating holes 42 include first inclined holes 41a and 42a and second inclined holes 41b and 42b, respectively.

The first inclined holes 41a and 42a both extend with a vertical inclination at about −75°. The second inclined holes 41b and 42b both extend with a vertical inclination at about 75°. In other words, the second inclined holes 41b and 42b extend in a direction intersecting with the first inclined holes 41a and 42a. The ends of the first inclined holes 41a and 42a are connected to the ends of the second inclined holes 41b and 42b.

The first or second communicating wall 36 or 37 with the first inclined holes 41a and 42a and the second inclined holes 41b and 42b includes first separation walls 65 and second separation walls 66.

The first separation walls 65 form one face of the first or second communicating wall 36 or 37. The first separation walls 65 are vertically aligned with a gap. The gaps among the first separation walls 65 form the ends of the first inclined holes 41a and 42a or the ends of the second inclined holes 41b and 42b.

The second separation walls 66 form the other face of the first or second communicating wall 36 or 37. The second separation walls 66 are vertically aligned with a gap. The gaps among the second separation walls 66 form the ends of the first inclined holes 41a and 42a or the ends of the second inclined holes 41b and 42b.

The first separation walls 65 and the second separation walls 66 are horizontally separated from each other with a gap. This creates a vertically extending clearance 67 between the first separation walls 65 and the second separation walls 66.

The first separation walls 65 in the modification illustrated in FIG. 10 are vertically aligned with a gap. The second separation walls 66 are vertically aligned with a gap. This inhibits the first inclined holes 41a and 42a and the second inclined holes 41b and 42b from expanding and from allowing the flying particles C at an undesired inclination angle to pass therethrough.

Further, the vertically extending clearance 67 is formed between the first separation walls 65 and the second separation walls 66. Thereby, vertically flying particles C can pass through the clearance 67 between the first separation walls 65 and the second separation walls 66.

Figure 11:
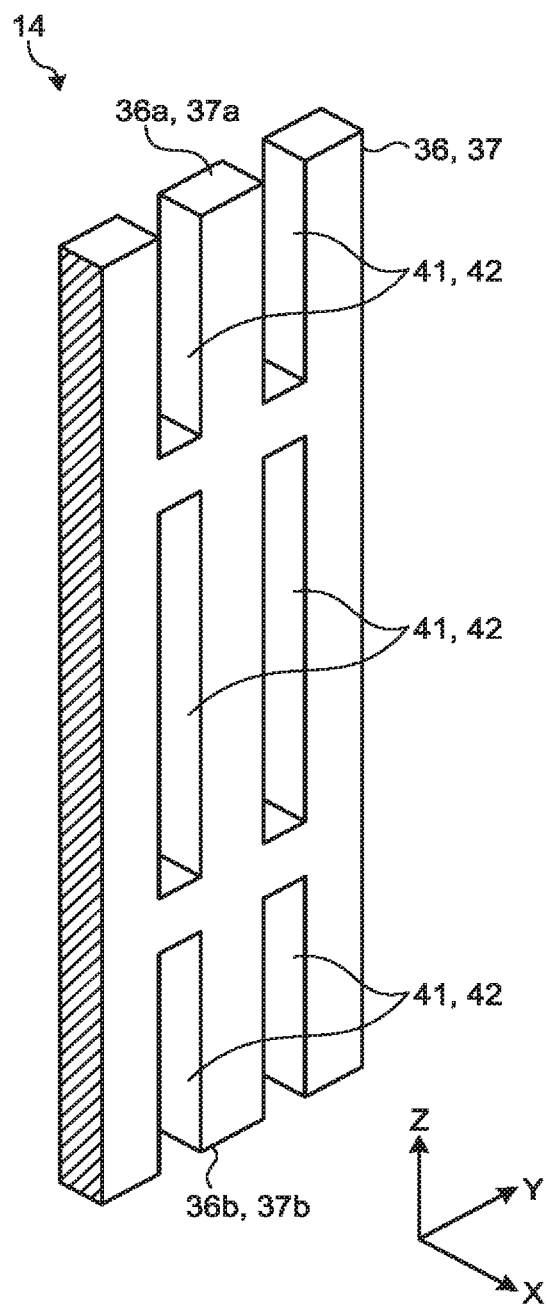
FIG. 11 is a perspective view schematically illustrating a part of a collimator according to a fourth embodiment.

A fourth embodiment is described below with reference to FIG. 11. FIG. 11 is a perspective view schematically illustrating a part of the collimator 14 according to the fourth embodiment. FIG. 11 illustrates an example of the first communicating wall 36 and the second communicating wall 37.

As illustrated in FIG. 11, some of the first or second communicating holes 41 and 42 extend up to the top end 36a or 37a of the first or second communicating wall 36 or 37. Further, some of the first or second communicating holes 41 and 42 extend down to the bottom end 36b or 37b of the first or second communicating wall 36 or 37. That is, the first or second communicating holes 41 or 42 include not only holes but also cutouts opened in one direction (for example, upward or downward) and slits opened in different directions (for example, upward and downward).

In the sputtering apparatus 1 according to the fourth embodiment, some of the first or second communicating holes 41 and 42 extend up to the top end 36a or 37a or down to the bottom end 36b or 37b of the first or second communicating wall 36 or 37. Thereby, the flying particles C in an inclined direction can easily pass through the first or second communicating holes 41 and 42.

Figure 12:
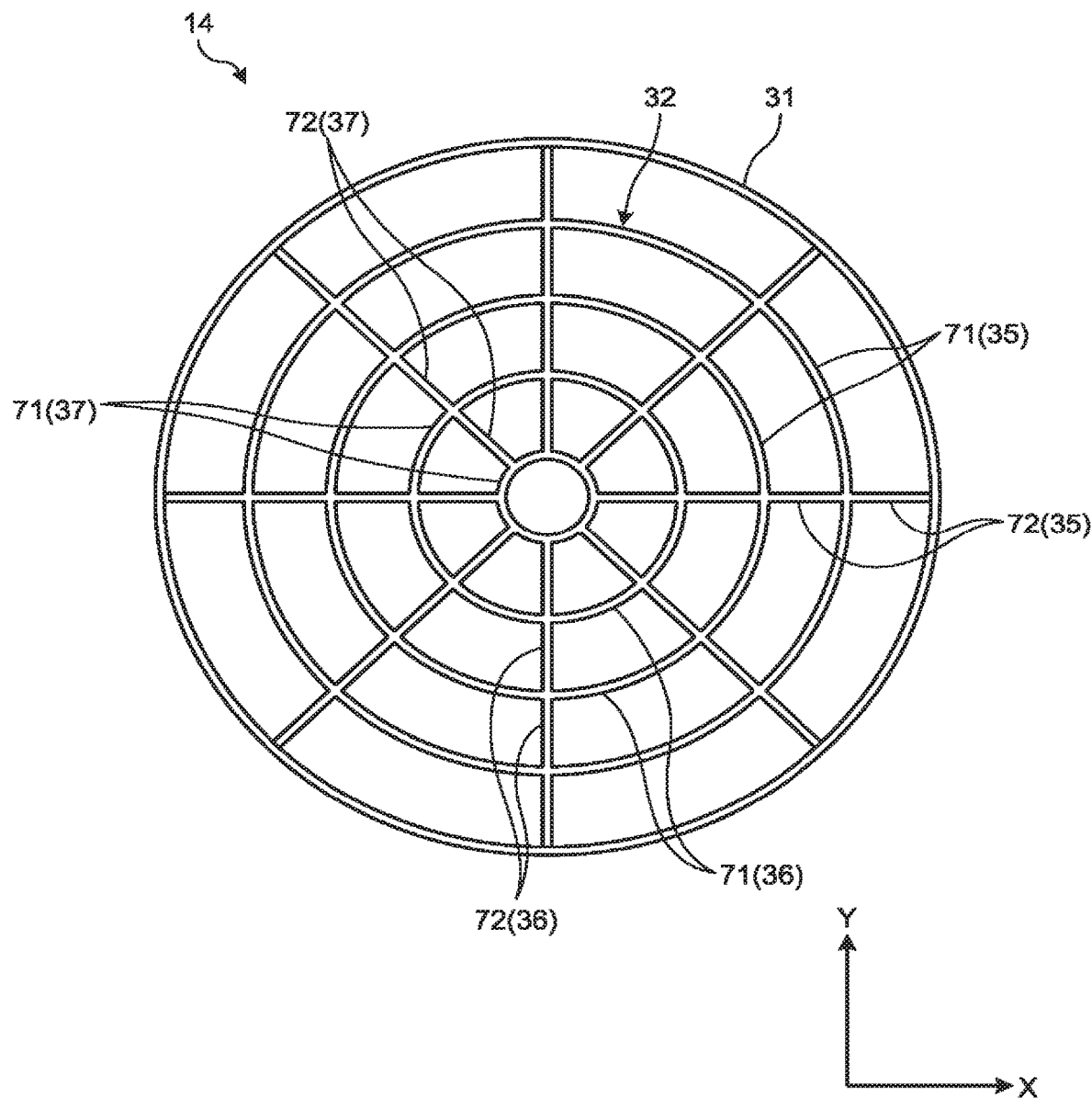
FIG. 12 is a plan view illustrating a collimator according to a fifth embodiment.

A fifth embodiment is described below with reference to FIG. 12. FIG. 12 is a plan view of the collimator 14 according to the fifth embodiment. As illustrated in FIG. 12, the collimator 14 according to the fifth embodiment includes circular walls 71 and connecting walls 72.

The circular walls 71 are arc-like parts arranged concentrically with the frame 31. The connecting walls 72 are linear parts, extending radially from the center of the frame 31. The connecting walls 72 connect the circular walls 71 with the frame 31.

The shield walls 35, the first communicating walls 36, and the second communicating walls 37 form the circular walls 71 and the connecting walls 72. That is, the circular walls 71 and the connecting walls 72 are each formed of any of the shield walls 35, the first communicating walls 36, and the second communicating walls 37. In other words, the collimator 14 includes the circular walls 71 and the connecting walls 72 formed of the shield wall 35, the circular walls 71 and the connecting walls 72 formed of the first communicating walls 36, and the circular walls 71 and the connecting walls 72 formed of the second communicating walls 37. The circular walls 71 and the connecting walls 72 can be formed of one or two of the shield walls 35, the first communicating walls 36, and the second communicating walls 37.

In the sputtering apparatus 1 according to the fifth embodiment, the shield walls 35, the first communicating walls 36, and the second communicating walls 37 form the circular walls 71 arranged concentrically, and the connecting walls 72 that connect the circular walls 71 with each other. Thereby, having passed through the through holes 39 of the collimator 14, the particles C form a film in a concentric form corresponding to the shape of a circular semiconductor wafer 2.

Figure 13:
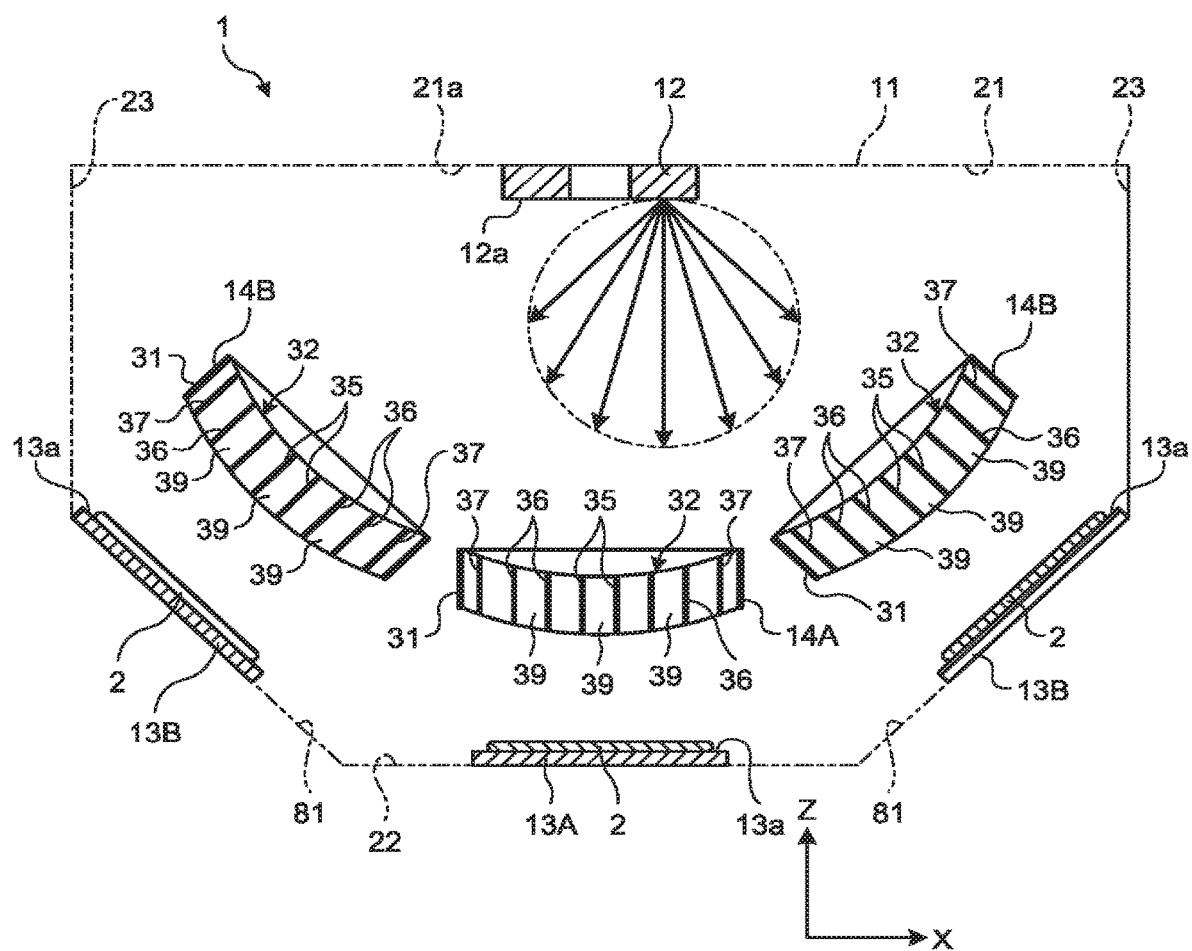
FIG. 13 is a sectional view schematically illustrating a sputtering apparatus according to a sixth embodiment.

A sixth embodiment is described below with reference to FIG. 13. FIG. 13 is a sectional view schematically illustrating the sputtering apparatus 1 according to the sixth embodiment. As illustrated in FIG. 13, the sputtering apparatus 1 according to the sixth embodiment includes three stages 13 and three collimators 14.

In the following description, the three stages 13 may be referred to as stages 13A and 13B individually. One stage 13A is an example of a first stage. Two stages 13B are an example of a second-object mount.

Further, in the following description, the three collimators 14 may be referred to as collimators 14A and 14B individually. One collimator 14A is an example of a first collimator. Two collimators 14B are an example of a second collimator.

The shape and position of the stage 13A are the same as those of the stage 13 according to any one of the first to fifth embodiments. The shape and position of the collimator 14A are the same as those of the collimator 14 according to any one of the first to fifth embodiments.

The processing chamber 11 further includes inclined walls 81. The inclined walls 81 are interposed between the bottom wall 22 and the side walls 23. The inclined walls 81 incline obliquely to the bottom wall 22. The stages 13B are attached to the inclined walls 81.

The stages 13B are spaced apart from the target 12 in an inclined direction (hereinafter, inclination-reference direction). The inclination-reference direction is an example of an inclined direction with respect to the first direction and a direction from the generator mount to the second-object mount. The distance between the target 12 and the stages 13B is substantially the same as the distance between the target 12 and the stage 13A.

The stages 13B also have the mount faces 13a. The mount faces 13a of the stages 13B support semiconductor wafers 2. The semiconductor wafers 2 supported on the stages 13B are an example of a second object.

The mount faces 13a of the stages 13B are an example of a second-object mount. The mount faces 13a of the stages 13B are substantially flat, facing in the inclination-reference direction. The mount faces 13a of the stage 13B are spaced apart from the inner face 21a of the top wall 21 in the inclination-reference direction. The semiconductor wafers 2 are placed on the mount faces 13a of the stages 13B.

The collimators 14B are placed between the target 12 and the stages 13B in the inclination-reference direction. The shape of the collimators 14B is substantially the same as that of the collimator 14A. That is, the collimators 14B each include the frame 31 and the rectifier 32 as with the collimator 14A. The rectifiers 32 of the collimators 14B include the shield walls 35, the first communicating walls 36, and the second communicating walls 37 as with that of the collimator 14A.

The shield walls 35 of the collimators 14B are an example of a third wall. The first and second communicating walls 36 and 37 of the collimators 14B are an example of a fourth wall. The first and second communicating holes 41 and 42 of the collimators 14B are an example of a second passage.

The shield walls 35, the first communicating walls 36, and the second communicating walls 37 of the collimators 14B form the through holes 39, as those of the collimator 14A. The through holes 39 of the collimators 14B are an example of a second through hole. The through holes 39 of the collimators 14B extend in the inclination-reference direction.

The particles C fly from the bottom face 12a of the target 12. The flying particles C and the flying particles C with a vertical inclination within a predetermined range fly through the through holes 39 of the collimator 14A toward the semiconductor wafer 2 supported on the stage 13A. Thereby, the particles C are deposited on the surface of the semiconductor wafer 2 supported on the stage 13A.

Meanwhile, the flying particles C in the inclination-reference direction and the flying particles C with an inclination within a predetermined range with respect to the inclination-reference direction fly through the through holes 39 of the collimators 14B toward the semiconductor wafers 2 supported on the stages 13B. Thereby, the particles C are also deposited on the surfaces of the semiconductor wafers 2 supported on the stages 13B. In other words, the semiconductor wafers 2 placed on the mount faces 13a of the stages 13B receive the particles C emitted from the target 12.

The sputtering apparatus 1 according to the sixth embodiment includes the stages 13B distant away from the target 12 in the inclination-reference direction, and the collimators 14B with the through holes 39 extending in the inclination-reference direction. Thereby, the sputtering apparatus 1 can use the flying particles C from the target 12 in the inclination-reference direction to form a film, further improving the sputtering efficiency. In other words, the sputtering apparatus 1 can use the flying particles C toward the side walls 23 of the processing chamber 11 to form a film, thereby improving throughput.

Figure 14:
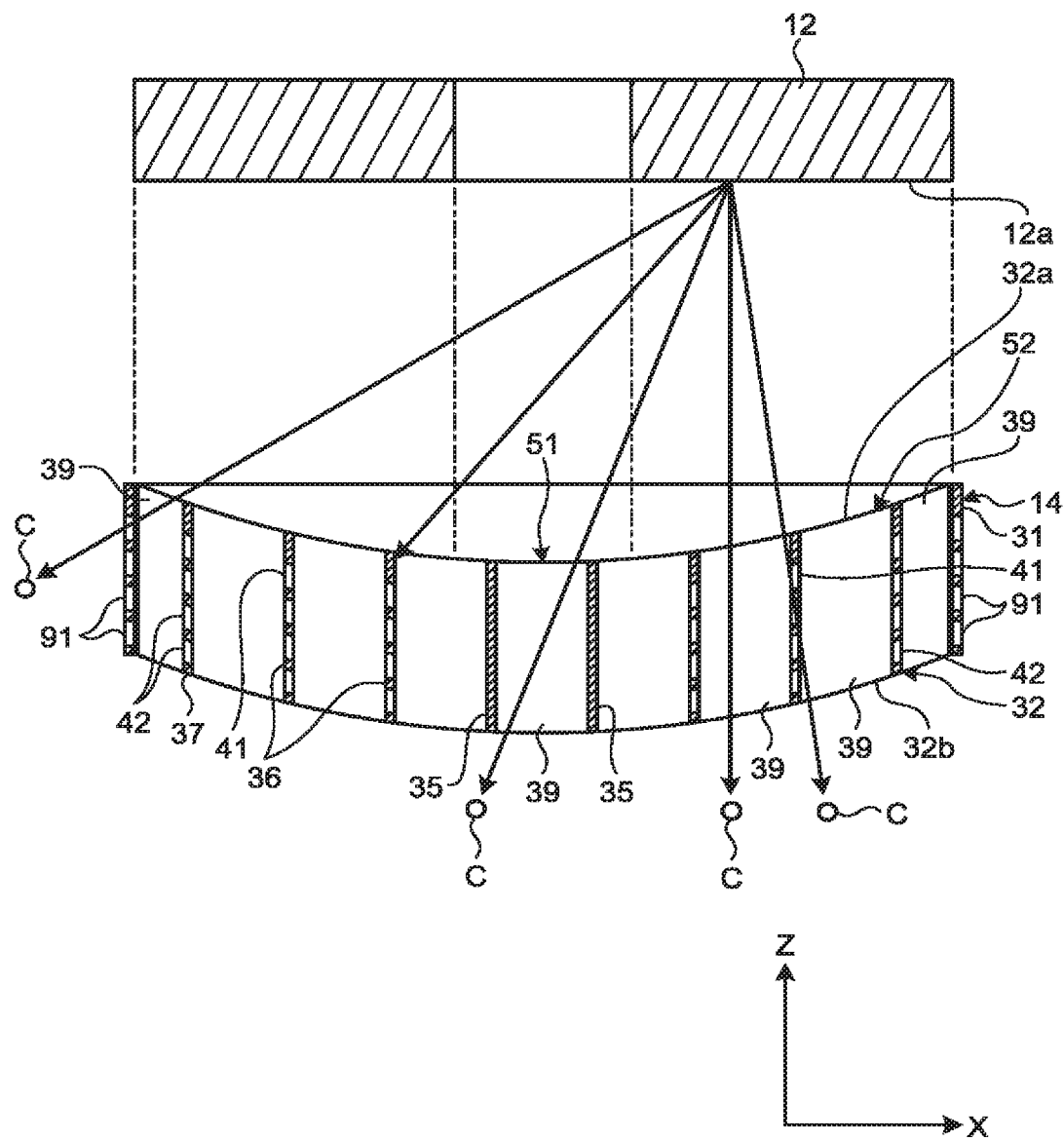
FIG. 14 is a sectional view schematically illustrating a target and a collimator according to a seventh embodiment.

A seventh embodiment is described below with reference to FIG. 14. FIG. 14 is a sectional view schematically illustrating the target 12 and the collimator 14 according to the seventh embodiment. As illustrated in FIG. 14, third communicating holes 91 are provided in the frame 31 of the collimator 14.

The third communicating holes 91 are, for example, parallelogram holes vertically or horizontally aligned. The shape and arrangement of the third communicating holes 91 are not limited thereto. The third communicating holes 91 have a longer vertical length than a horizontal length. That is, the third communicating holes 91 are vertically extending holes.

The third communicating holes 91 connect the through holes 39 adjacent to the frame 31 to the outside of the frame 31 in a radial direction of the collimator 14. In other words, the third communicating holes 91 penetrate the frame 31.

The particles C fly from the bottom face 12a of the target 12. The flying particles C vertically inclined at an angle over a predetermined range may pass through the third communicating holes 91. For example, in a case where a number of semiconductor wafers 2 are placed in the sputtering apparatus 1, the particles C having passed through the third communicating holes 91 may adhere to semiconductor wafers 2 different from the semiconductor wafer 2 located below the collimator 14.

In the sputtering apparatus 1 according to the seventh embodiment, the frame 31 is provided with the third communicating holes 91. For example, the semiconductor wafer 2, to which a small amount of flying particles C at a vertically inclined angle over the predetermined range adhere, may exert a desired property. In this case, the particles C having passed through the third communicating holes 91 can be used to form films, thereby improving the sputtering efficiency. In the sputtering apparatus 1 in which one semiconductor wafer 2 is placed, the frame 31 can be also provided with the third communicating holes 91.

Figure 15:
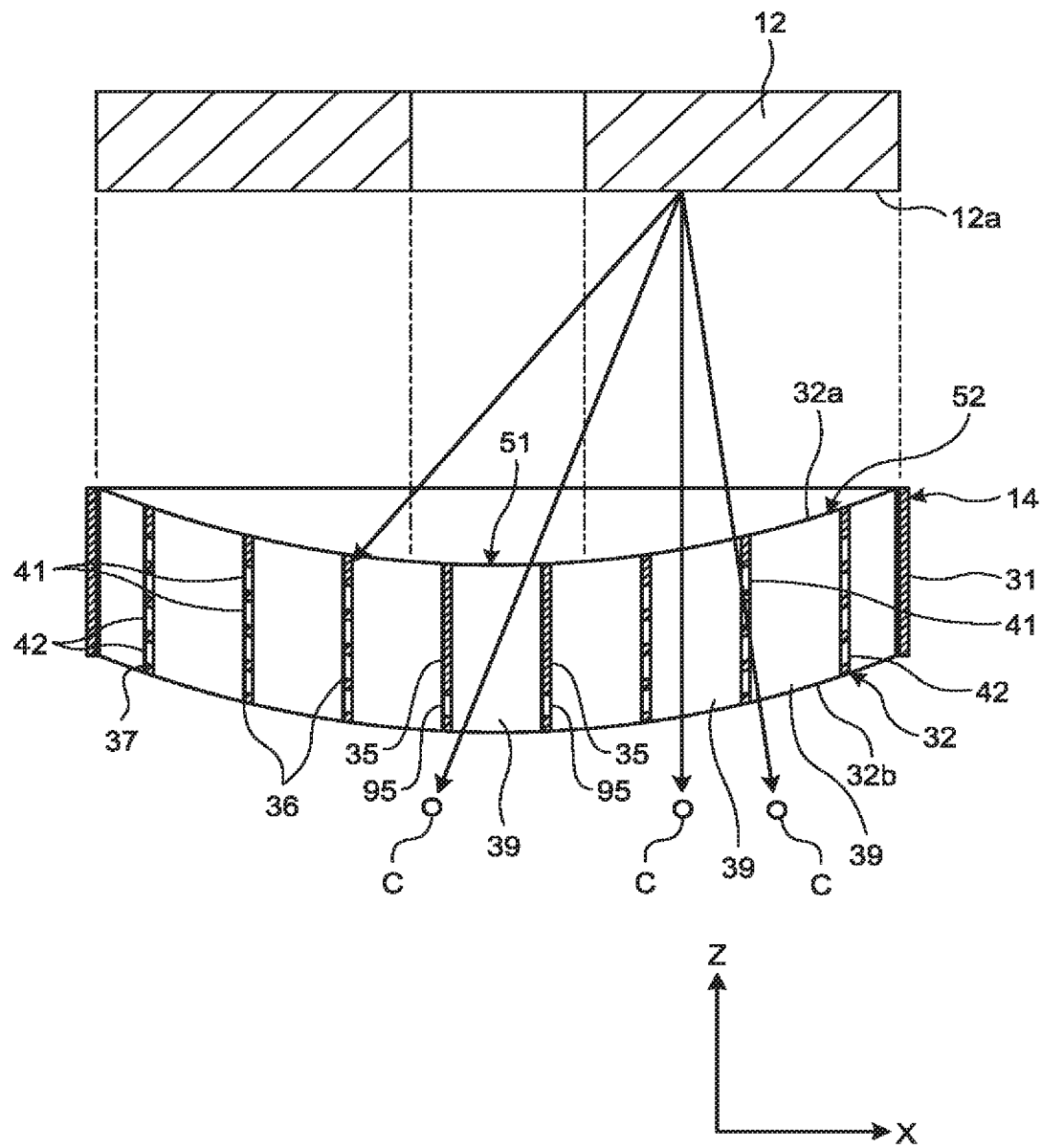
FIG. 15 is a sectional view schematically illustrating a target and a collimator according to an eighth embodiment.

An eighth embodiment is described below with reference to FIG. 15. FIG. 15 is a sectional view schematically illustrating the target 12 and the collimator 14 according to the eighth embodiment. As illustrated in FIG. 15, a fourth communicating hole 95 is provided in each shield wall 35 according to the eighth embodiment.

The fourth communicating holes 95 are for example parallelogram holes horizontally aligned. The shape and arrangement of the fourth communicating holes 95 are not limited thereto. The fourth communicating holes 95 have a longer vertical length than a horizontal length. That is, the fourth communicating holes 95 are vertically extending holes.

The fourth communicating holes 95 each connect two through holes 39 separated by the shield wall 35 provided with the fourth communicating hole 95. In other words, each fourth communicating hole 95 opens into one through hole 39 and its adjacent through hole 39.

The fourth communicating holes 95 are smaller than the first communicating holes 41. The density of the fourth communicating holes 95 in the shield walls 35 is lower than that of the first communicating holes 41 in the first communicating walls 36. Further, the density of the fourth communicating holes 95 in the shield walls 35 is lower than that of the second communicating holes 42 in the second communicating walls 37.

As described in the eighth embodiment, the shield walls 35 as an example of the first wall may be provided with a passage such as the fourth communicating hole 95. That is, all the walls (the shield walls 35, the first communicating walls 36, and the second communicating walls 37) forming the through holes 39 may be provided with passages such as the first, second, and fourth communicating holes 41, 42, and 95. The shield walls 35 of the collimators 14B according to the sixth embodiment exemplifying the third wall may be provided with a passage such as the fourth communicating hole 95.

In at least one of the embodiments described above, the sputtering apparatus 1 is an example of a processing apparatus. However, the processing apparatus can be another apparatus such as a deposition apparatus or an X-ray computed tomography scanner.

In case of using the processing apparatus for a deposition apparatus, for example, a material to be evaporated is an example of the particle generator, the vapor generated from the material is an example of the particles, and a processing target to be evaporated is an example of the first object. The vapor being a gasified substance contains one or two or more kinds of molecules. The molecules are particles. In the deposition apparatus, the collimator 14 is placed, for example, between a position of the material to be evaporated and a position of the processing target.

In case of using the processing apparatus for an X-ray computed tomography scanner, for example, an X-ray tube that emits X-rays is an example of the particle generator, the X-rays are an example of the particles, and a subject to be irradiated with the X-rays is an example of the first object. The X-rays are a kind of electromagnetic waves which are microscopically photons as a type of elemental particles. The element particles are particles. In the X-ray computed tomography scanner, the collimator 14 is placed, for example, between a position of the X-ray tube and a position of the subject.

In the X-ray computed tomography scanner, the X-ray irradiation amount from the X-ray tube is uneven in an irradiation area. Provided with the collimator 14, the X-ray computed tomography scanner can uniformly irradiate the amount of X-rays in the irradiation area. It further can adjust the irradiation area. In addition, it can prevent unnecessary radiation exposure.

According to at least one of the embodiments described above, the first walls and the second walls provided with the first passages of the first collimator form the first through holes extending in the first direction. Thereby, the particles emitted from a particle generator in an inclined direction with respect to the first direction within a predetermined angle range can pass through the first passages, and the particles emitted from the particle generator in a direction largely inclined over the predetermined angle range with respect to the first direction can be blocked.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A processing apparatus comprising:
a generator mount on which a particle generator is placed, the particle generator capable of emitting particles;
a first-object mount spaced apart from the generator mount, on which a first object is placed, the first object that receives the particles; and
a first collimator placed between the generator mount and the first-object mount, including first walls, second walls, a first end facing the generator mount, and a second end being opposite to the first end and facing the first-object mount, in which
the first walls and the second walls form first through holes extending in a first direction from the generator mount to the first-object mount, and
each of the second walls is provided with at least one first passage which penetrates the second wall and through which the particles can pass, wherein
the first walls and the second walls become thicker in thickness from the first end to the second end,
areas of cross sections of each of the first through holes decrease from the first end toward the second end when the cross sections are taken in planes orthogonal to the first direction,
the first passage connects two of the first through holes that are partitioned with the second wall, and
the second walls include a first communicating wall and a second communicating wall, a density of the first passage in the second communicating wall being larger than a density of the first passage in the first communicating wall.

2. The processing apparatus according to claim 1, wherein in a region of the first collimator configured to face the particle generator, a larger number of the second walls are arranged than that of the first walls, and
in a region of the first collimator offset from the particle generator, a larger number of the first walls are arranged than that of the second walls.

3. The processing apparatus according to claim 1, wherein the first collimator includes a first part and a second part,
a ratio of an amount of the particles, which are emitted from the particle generator in an inclined direction with respect to the first direction and travel to the first part, to an amount of the particles, which are emitted from the particle generator in the first direction and travel to the first part, is larger than a ratio of an amount of the particles, which are emitted from the particle generator in the inclined direction with respect to the first direction and travel to the second part, to an amount of the particles, which are emitted from the particle generator in the first direction and travel to the second part,
a larger number of the first walls are arranged than that of the second walls in the first part, and
a larger number of the second walls are arranged than that of the first walls in the second part.

4. The processing apparatus according to claim 1, wherein the first walls and the second walls are arranged in a predetermined distribution in accordance with a shape of the particle generator to be placed on the generator mount.

5. The processing apparatus according to claim 1, wherein the first end of the first walls and the second walls facing the generator mount forms one end of the first collimator, the one end depressed with respect to the generator mount.

6. The processing apparatus according to claim 1, wherein a length of the first passage is longer in the first direction than in a second direction orthogonal to the first direction.

7. The processing apparatus according to claim 1, wherein the first walls and the second walls form circular walls and connecting walls, the circular walls being arranged concentrically, the connecting walls connecting the circular walls with each other.

8. The processing apparatus according to claim 1, further comprising:
a second-object mount spaced apart from the generator mount in an inclined direction with respect to the first direction, the second-object mount on which a second object that receives the particles is placed; and
a second collimator placed between the generator mount and the second-object mount, including third walls and fourth walls, in which
the third walls and the fourth walls form second through holes extending in a third direction from the generator mount to the second-object mount, and
each of the fourth walls is provided with at least one second passage which penetrates the fourth walls and through which the particles can pass.

9. A collimator comprising
first walls and second walls that form through holes extending in an extending direction from a first end to a second end being opposite to the first end, each of the second walls provided with at least one passage that penetrates the second wall and through which a particle can pass, wherein
the first walls and the second walls become thicker from the first end to the second end in the extending direction of the through holes,
areas of cross sections of each of the through holes decrease from the first end toward the second end when the cross sections are taken in planes orthogonal to the extending direction,
the passage connects two of the through holes that are partitioned with the second wall, and
the second walls include a first communicating wall and a second communicating wall, a density of the passage in the second communicating wall being larger than a density of the passage in the first communicating wall.

10. The collimator according to claim 9, wherein the first end of the first walls and the second walls in the extending direction of the through holes forms one end of the collimator, the one end being depressed.

11. The collimator according to claim 9, wherein a length of the passage is longer in the extending direction of the through holes than in a direction orthogonal to the extending direction of the through holes.

12. The collimator according to claim 9, wherein the first walls and the second walls form circular walls and connecting walls, the circular walls being arranged concentrically, the connecting walls connecting the circular walls with each other.

13. A processing apparatus comprising:
a generator mount on which a particle generator capable of emitting particles is placed;
an emission target spaced apart from the generator mount in a direction in which the particle generator on the generator mount emits at least one particle; and
a collimator including a first end facing the generator mount, and a second end being opposite to the first end and facing the emission target, and walls, the walls forming through holes extending in an extending direction from the generator mount to the emission target, at least one of the walls being provided with at least one passage that penetrates the wall and through which the particles can pass, wherein
the walls become thicker from the first end to the second end, and
areas of cross sections of each of the through holes decrease from the first end toward the second end when the cross sections are taken in planes orthogonal to the extending direction,
the passage connects two of the through holes that are partitioned with the at least one of the walls being provided with the at least one passage, and
the walls include a first communicating wall and a second communicating wall, a density of the passage in the second communicating wall being larger than a density of the passage in the first communicating wall.

* * * * *